(12) United States Patent
Jang et al.

(10) Patent No.: US 8,064,249 B2
(45) Date of Patent: Nov. 22, 2011

(54) NANOWIRE ELECTROMECHANICAL SWITCHING DEVICE, METHOD OF MANUFACTURING THE SAME AND ELECTROMECHANICAL MEMORY DEVICE USING THE NANOWIRE ELECTROMECHANICAL SWITCHING DEVICE

(75) Inventors: Jae-Eun Jang, Yongin-si (KR);
Seung-Nam Cha, Yongin-si (KR);
Byong-Gwon Song, Yongin-si (KR);
Yong-Wan Jin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 998 days.

(21) Appl. No.: 11/889,515

(22) Filed: Aug. 14, 2007

(65) Prior Publication Data
US 2008/0061351 A1    Mar. 13, 2008

(30) Foreign Application Priority Data

Sep. 11, 2006    (KR) .................. 10-2006-0087426

(51) Int. Cl.
*G11C 11/50*    (2006.01)

(52) U.S. Cl. ......... 365/164; 365/151; 365/154; 977/943
(58) Field of Classification Search ............... 200/181;
365/151, 154, 164; 977/943
See application file for complete search history.

(56) References Cited

U.S. PATENT DOCUMENTS

| | | | | |
|---|---|---|---|---|
| 4,876,669 | A * | 10/1989 | Yamamoto et al. | 365/189.15 |
| 6,625,047 | B2 * | 9/2003 | Coleman, Jr. | 365/51 |
| 7,336,527 | B1 * | 2/2008 | McClelland | 365/164 |
| 7,348,591 | B2 * | 3/2008 | Yamauchi et al. | 257/9 |
| 7,382,648 | B2 * | 6/2008 | Bockrath | 365/164 |
| 7,564,085 | B2 * | 7/2009 | Jang et al. | 257/296 |
| 7,612,270 | B1 * | 11/2009 | Zhu | 257/314 |
| 7,719,111 | B2 * | 5/2010 | Jang et al. | 257/741 |

OTHER PUBLICATIONS

Jang et al., "Nanoelectromechanical DRAM for ultra-large-scale intergration (ULSI)," Electron Devices Meeting, 2005 (Dec. 5, 2005). IEDM Technical Digest. IEEE International, pp. 261-264.*
Jang et al., "Nanotube based Vertical Nano-devices for High Integration Density," Emerging Technologies—Nanoelectronics, 2006 IEEE Conference on (Jan. 10-13, 2006), pp. 89-92.*

* cited by examiner

Primary Examiner — Alexander Sofocleous
(74) Attorney, Agent, or Firm — Cantor Colburn LLP

(57) ABSTRACT

A nanowire electromechanical switching device is constructed with a source electrode and a drain electrode disposed on an insulating substrate and spaced apart from each other, a first nanowire vertically grown on the source electrode and to which a $V_1$ voltage is applied, a second nanowire vertically grown on the drain electrode and to which a $V_2$ voltage having an opposite polarity to that of the $V_1$ voltage is applied, and a gate electrode spaced apart from the second nanowire, partially surrounding the second nanowire and having an opening that faces the first nanowire in order to avoid disturbing a mutual switching operation of the first nanowire and the second nanowire and to which a $V_3$ voltage having the same polarity as that of the $V_2$ voltage is applied.

12 Claims, 24 Drawing Sheets

NANOWIRE ELECTROMECHANICAL SWITCHING DEVICE, METHOD OF MANUFACTURING THE SAME AND ELECTROMECHANICAL MEMORY DEVICE USING THE NANOWIRE ELECTROMECHANICAL SWITCHING DEVICE

CLAIM OF PRIORITY

This application makes reference to, incorporates the same herein, and claims all benefits accruing under 35 U.S.C. §119 from an application for NANOWIRE ELECTROMECHANICAL SWITCHING DEVICE, METHOD OF MANUFACTURING THE SAME AND ELECTROMECHANICAL MEMORY DEVICE USING THE NANOWIRE ELECTROMECHANICAL SWITCHING DEVICE earlier filed in the Korean Intellectual Property Office on Sep. 11, 2006 and there duly assigned Ser. No. 10-2006-0087426.

BACKGROUND OF THE INVENTION

1. Field of the Invention

The present invention relates to a switching device, and more particularly, to a nanowire electromechanical switching device having an improved structure in which stable on-off switching characteristics between two nanowires that contact each other and that are switched and low-voltage driving characteristics are shown, and a method for manufacturing the same.

2. Description of the Related Art

A contemporary nanowire switching device is typically constructed with an insulating substrate, first and second electrodes disposed on the insulating substrate, and first and second nanowires vertically grown on the first and second electrodes, respectively. If a certain voltage difference is applied between the first electrode and the second electrode, a positive charge and a negative charge are accumulated on the first nanowire and the second nanowire, respectively. Thus, an electrostatic force, that is, an attractive force, may be induced between the first nanowire and the second nanowire, and the first nanowire and the second nanowire are elastically deformed so that ends of the first nanowire and the second nanowire can contact each other and current can be conducted through the first nanowire and the second nanowire. Therefore, the nanowire switching device is switched on.

In order to induce elastic deformation of nanowires in a switching device having the above 2-electrode structure, however, a high driving voltage of about 25 V to 50 V between the first and second electrodes is required. When a driving voltage is high, a large current flows through nanowires. There is a problem that arching and burning phenomena may occur in a portion in which the nanowires contact each other. These phenomena deleteriously cause switching characteristics a switching device to be deteriorated and the life span of the switching device to be reduced.

SUMMARY OF THE INVENTION

It is therefore an object of the present invention to provide an improved nanowire electromechanical switching device.

It is another object to provide a nanowire electromechanical switching device having an improved structure in which stable on and off switching characteristics between two strands of nanowires that contact each other and low-voltage driving characteristics are shown, a method for manufacturing the same, and an electromechanical memory device using the nanowire electromechanical switching device.

According to an aspect of the present invention, there is provided a nanowire electromechanical switching device, constructed with: a source electrode and a drain electrode disposed on an insulating substrate and spaced apart from each other; a first nanowire vertically grown on the source electrode and to which a $V_1$ voltage is applied; a second nanowire vertically grown on the drain electrode and to which a $V_2$ voltage having an opposite polarity to that of the $V_1$ voltage is applied; and a gate electrode spaced apart from the second nanowire, partially surrounding the second nanowire and having an opening that faces the first nanowire to avoid disturbing a mutual switching operation of the first nanowire and the second nanowire and to which a $V_3$ voltage having the same polarity as that of the $V_2$ voltage is applied. By an action between an electrostatic force between both of the first and second nanowires and the gate electrode and an elastic restoration force of the second nanowire, the first and second nanowires may either contact or disconnect from each other so that the nanowire electromechanical switching device is either switched on or switched off.

According to another aspect of the present invention, there is provided a method for manufacturing a nanowire electromechanical switching device, the method including: forming an electrode layer on an insulating substrate; forming a source electrode and a drain electrode by patterning the electrode layer; vertically growing first and second nanowires on the source electrode and the drain electrode, respectively; and forming a gate electrode, which is spaced apart from the second nanowire, partially surrounding the second nanowire and having an opening that faces the first nanowire in order to avoid disturbing a mutual switching operation of the first nanowire and the second nanowire.

The forming of the gate electrode may comprise: forming a first dielectric layer that surrounds the source electrode and the first nanowire and a second dielectric layer that surrounds the drain electrode and the second nanowire on the insulating substrate; forming a gate electrode, which partially surrounds the second nanowire and bears an opening facing the first nanowire, on the second dielectrics layer; and etching and removing the first and second dielectric layers.

According to another aspect of the present invention, there is provided an electromechanical memory device, the electromechanical memory device is constructed with: a source electrode and a drain electrode disposed on an insulating substrate and spaced apart from each other; a nanowire capacitor formed on the source electrode, and including a first nanowire which is vertically grown on the source electrode and to which a $V_1$ voltage is applied, a first dielectric layer which surrounds the source electrode and the first nanowire, and a floating electrode formed on an outer surface of the first dielectric layer; a second nanowire vertically grown on the drain electrode and to which a $V_2$ voltage having an opposite polarity to that of the $V_1$ voltage is applied; and a gate electrode spaced apart from the second nanowire, partially surrounding the second nanowire and having an opening that faces the nanowire capacitor in order to avoid disturbing a mutual switching operation of the nanowire capacitor and the second nanowire and to which a $V_3$ voltage having the same polarity as that of the $V_2$ voltage is applied. By an action between an electrostatic force between both of the first and second nanowires and the gate electrode and an elastic restoration force of the second nanowire, the second nanowire may either contact or disconnect from the nanowire capacitor so that the electromechanical memory device is either switched on or switched off.

According to another aspect of the present invention, there is provided a method for manufacturing an electromechanical memory device, the method including: forming an electrode layer on an insulating substrate; forming a source electrode and a drain electrode by patterning the electrode layer; vertically growing first and second nanowires on the source electrode and the drain electrode, respectively; forming a first dielectric layer that surrounds the source electrode and the first nanowire and a second dielectric layer that surrounds the drain electrode and the second nanowire on the insulating substrate; forming a nanowire capacitor including the first nanowire, the first dielectric layer, and a floating electrode on the source electrode by forming the floating electrode on an outer surface of the first dielectric layer; forming a gate electrode, which surrounds the second nanowire and has an opening facing the nanowire capacitor, on the second dielectric layer; and etching and removing the second dielectric layer.

The forming of the nanowire capacitor and the forming of the gate electrode may be simultaneously performed.

According to the present invention, a nanowire electromechanical switching device having an improved structure in which stable on-off switching characteristics between two strands of nanowires that contact each other and are switched and low-voltage driving characteristics are shown, can be manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
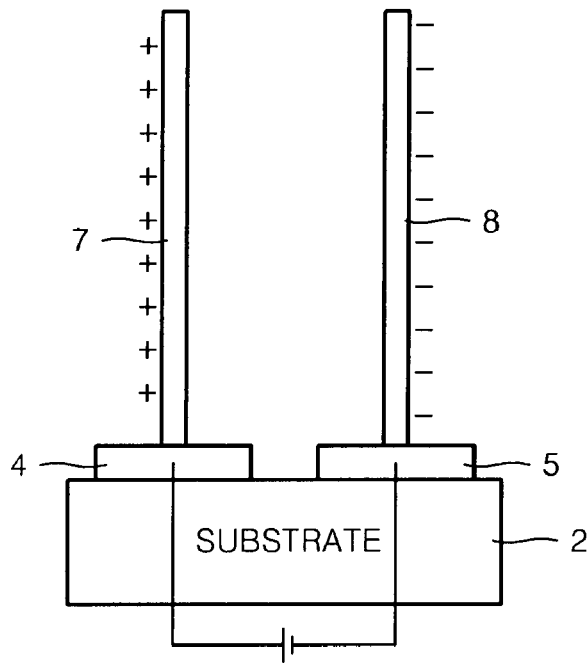
FIG. 1 is a schematic cross-sectional view of a contemporary switching device.

The present invention will now be described more fully with reference to the accompanying drawings, in which exemplary embodiments of the invention are shown. In the drawings, the thicknesses of layers and regions are exaggerated for clarity.

Figure 2:
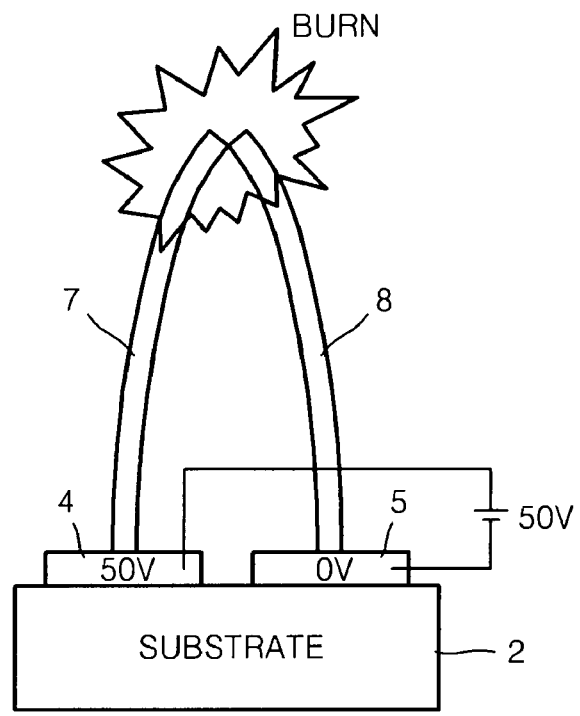
FIG. 2 is a cross-sectional view illustrating the operation of the contemporary switching device.

FIG. 1 is a schematic cross-sectional view of a contemporary nanowire switching device, and FIG. 2 is a cross-sectional view illustrating the operation of the contemporary nanowire switching device.

Referring to FIG. 1, the contemporary nanowire switching device is constructed with an insulating substrate 2, first and second electrodes 4 and 5 disposed on insulating substrate 2, and first and second nanowires 7 and 8 vertically grown on first and second electrodes 4 and 5, respectively. If a certain voltage difference is applied between first electrode 4 and second electrode 5, positive (+) charges and negative (−) charges are accumulated on first nanowire 7 and second nanowire 8, respectively. Thus, an electrostatic force, that is, an attractive force, may be induced between first nanowire 7 and second nanowire 8, and thus first nanowire 7 and second nanowire 8 are elastically deformed so that the ends of first and second nanowires 7 and 8 can contact each other and an electrical current can flow through first and second nanowires 7 and 8. Therefore, the nanowire switching device can be switched on. In order to induce the elastic deformation of nanowires in a switching device having the above two-electrode structure, however, a high driving voltage of about 25 V to 50 V between first and second electrodes 4 and 5 is required. When a driving voltage is high in this way, a large current flows through nanowires, and there is a problem that arching and burning phenomena may undesirably occur at a portion where the nanowires contact each other. These phenomena cause switching characteristics of the nanowire switching device to be deteriorated and the life span of the device to be reduced.

Figure 3:
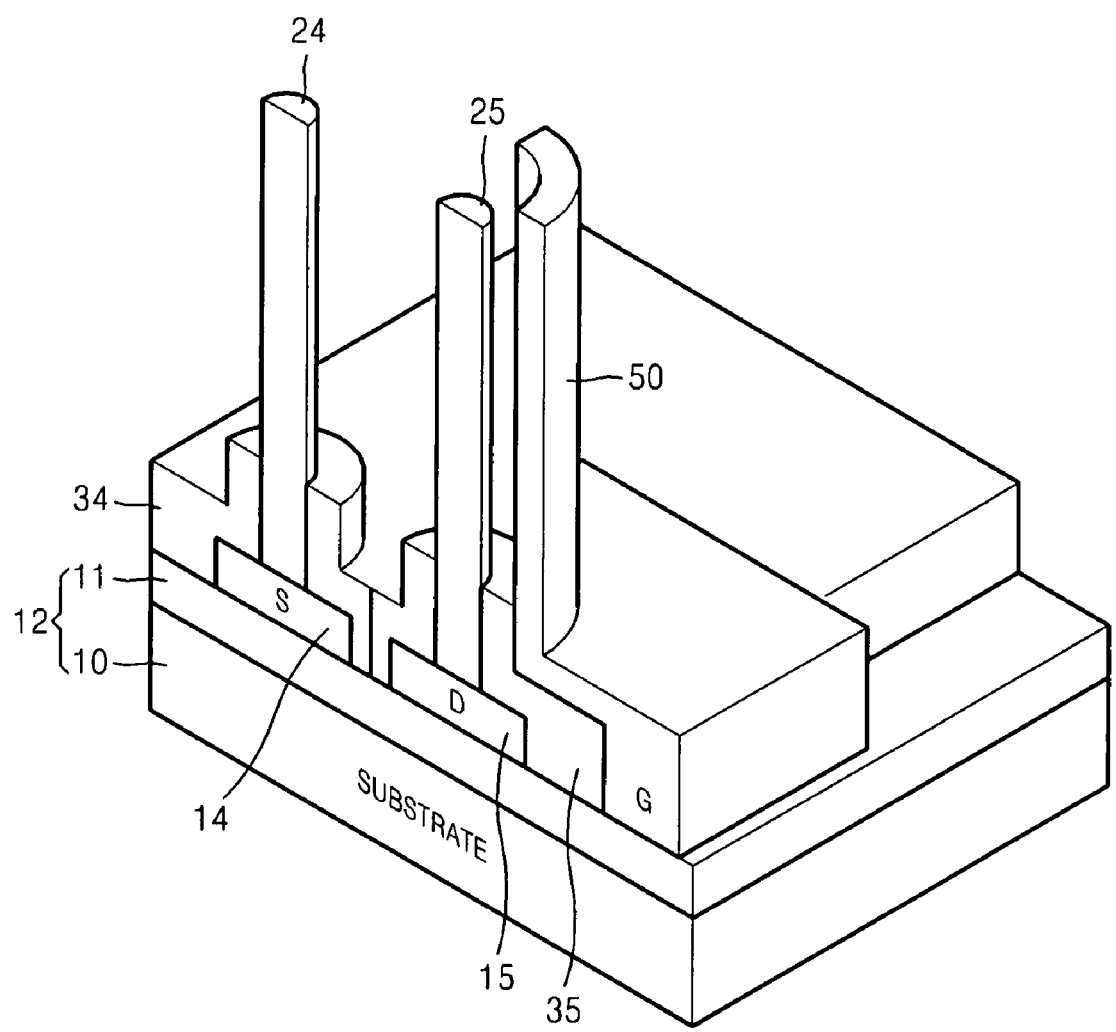
FIG. 3 is a schematic view of a nanowire electromechanical switching device constructed as an embodiment of the principles of the present invention.
Figure 4:
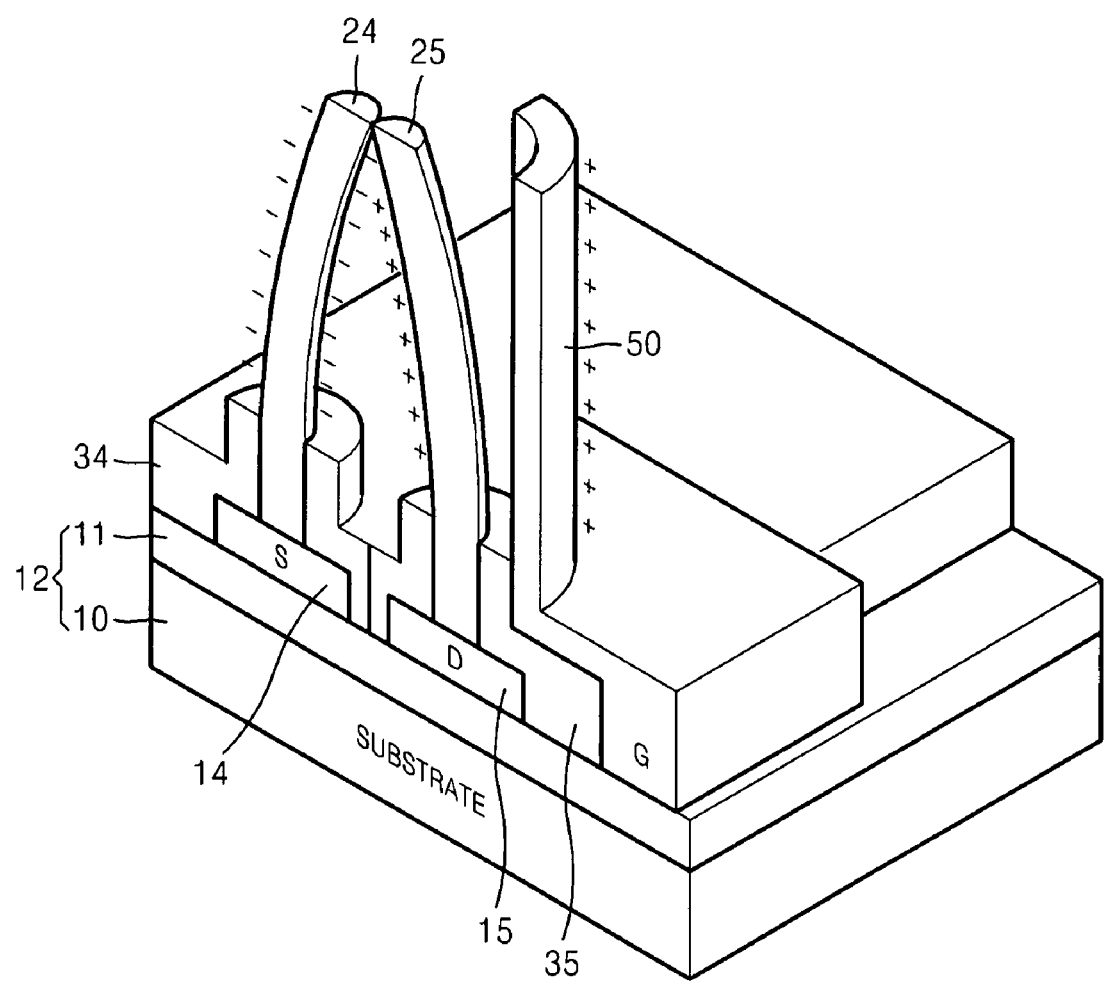
FIG. 4 is a schematic view illustrating the operation of the nanowire electromechanical switching device illustrated in FIG. 3.

FIG. 3 is a schematic view of a nanowire electromechanical switching device according to an embodiment of the present invention, and FIG. 4 is a schematic view illustrating the operation of the nanowire electromechanical switching device illustrated in FIG. 3.

Referring to FIGS. 3 and 4, the nanowire electromechanical switching device according to the principles of the present invention is constructed with a source electrode 14, a drain electrode 15, and a gate electrode 50, that are formed on an insulating substrate 12, and first and second nanowires 24 and 25 that are vertically grown on source and drain electrodes 14 and 15, respectively. Here, a $V_1$ voltage may be applied to first nanowire 24, and a $V_2$ voltage having an opposite polarity to that of the $V_1$ voltage may be applied to second nanowire 25. A glass substrate, a plastic substrate or other substrate designed to have insulating characteristics may be used as insulating substrate 12. For example, insulating substrate 12 may include an Si substrate 10 and an $SiO_2$ insulating layer 11 formed on Si substrate 10. Each of source electrode 14, drain electrode 15, and gate electrode 50 may be made from at least one material selected from the group consisting of Nb, Cr, Mo, W, Ti, Pt, Au, ITO, and Ag.

Specifically, in the structure of the nanowire electromechanical switching device according to the principles of the present invention, source electrode (S) 14 and drain electrode (D) 15 are disposed on insulating substrate 12 and are spaced apart from each other. In particular, gate electrode 50 is spaced apart from second nanowire 25, partially surrounding second nanowire 25 and having an opening that faces first nanowire 24 to avoid disturbing a mutual switching operation of first nanowire 24 and second nanowire 25 by gate electrode 50. Gate electrode 50 may be formed as a half-cylinder type structure having a height of approximately 0.1 μm to approximately 100 μm. Gate electrode 50 is spaced apart from second nanowire 25 by a distance of approximately 5 nm to approximately 5000 nm. A $V_3$ voltage having the same polarity as that of the $V_2$ voltage may be applied to gate electrode 50. Gate electrode 50 and drain electrode 15 are insulated from each other.

Each of first and second nanowires 24 and 25 may be made from one material selected from the group consisting of a carbon-based material, a Pt-based material, an Si-based material, a GaN-based material, a GaAs-based material, and a ZnO-based material. For example, each of first and second nanowires 24 and 25 is made from one material selected from the group consisting of carbon fiber, carbon nanotubes (CNT), Pt, Si, GaN, GaAs, and ZnO. Each of the first and second nanowires 24 and 25 may be formed to have a diameter of approximately 1 nm to approximately 200 nm and a height of approximately 0.1 μm to approximately 100 μm. In FIGS. 3 and 4, reference numerals 34 and 35 denote first and second dielectric layers 34 and 35, respectively, that are not etched during the manufacture process of the nanowire electromechanical switching device and that remain on outer surfaces of source and drain electrodes 14 and 15. The remaining first and second dielectric layers 34 and 35 may be used as a reinforcement material for supporting first and second nanowires 24 and 25. Alternatively, first and second dielectric layers 34 and 35 that remain on the outer surfaces of source and drain electrodes 14 and 15 may be completely etched and removed.

In the nanowire electromechanical switching device according to the present invention, when the voltages $V_1$, $V_2$, and $V_3$ are applied to first and second nanowires 24 and 25 and gate electrode 50, respectively, electrostatic force may be induced between first and second nanowires 24 and 25, and gate electrode 50. Specifically, an attractive force may be induced between first and second nanowires 24 and 25, and a repulsive force may be induced between second nanowire 25 and gate electrode 50. Thus, first and second nanowires 24 and 25 may be elastically deformed by the electrostatic force, that is, may be bent and contact each other, and thus the switching device is switched on. And, when at least one voltage of the $V_1$, $V_2$, and $V_3$ voltages is removed, second nanowire 25, which was electrically deformed, is restored to its original state by an elastic restoration force, and thus the switching device is switched off. Thus, by adjusting magnitudes of the $V_1$, $V_2$, $V_3$ voltages, nanowires 24 and 25 can either contact each other or disconnect from each other, and therefore the switching device may be either switched on or switched off.

According to the present invention, since the distance between gate electrode 50 and second nanowire 25 is very narrow, and is in the range of approximately 5 nm to approximately 5000 nm, the efficiency of the electrostatic force induced between first and second nanowires 24 and 25 and gate electrode 50 can be maximized and thus, a driving voltage of the electromechanical switching device can be greatly reduced to be less than 5 V. Specifically, in the present embodiment, voltages of 0 V, 0.1 V, and 5 V are applied to source, drain, and gate electrodes 14, 15, and 50, respectively, so that the nanowire electromechanical switching device can be either switched on or switched off. Since, in this way, the nanowire electromechanical switching device according to the present invention is driven by a low voltage and a voltage difference between first and second nanowires 24 and 25 is sufficiently small, a burning phenomenon does not occur between first and second nanowires 24 and 25 when the switching device is switched on, and therefore stable on and off switching characteristics are achieved. The nanowire electromechanical switching device according to the present invention has excellent switching characteristics, high mobility, and high performance compared to a contemporary silicon transistor, can be manufactured to a nano size and thus can be ultra-highly integrated.

FIGS. 5A through 5H illustrate a method for manufacturing a nanowire electromechanical switching device according to an embodiment of the principles of the present invention. Here, respective material layers may be formed by using thin film deposition that is generally used in a semiconductor manufacturing process, for example, physical vapor deposition (PVD), chemical vapor deposition (CVD) or spin coating. These methods have been already well-known and thus, detailed descriptions thereof will be omitted.

Figure 5A:
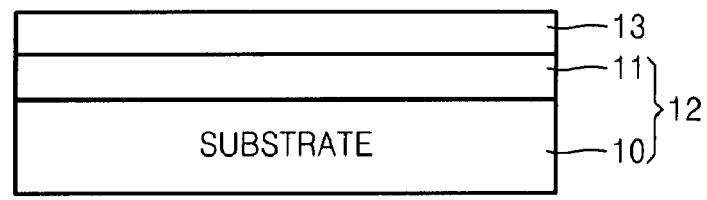
FIGS. 5A through 5H illustrate a method for manufacturing a nanowire electromechanical switching device according to an embodiment of the principles of the present invention.
Figure 5B:
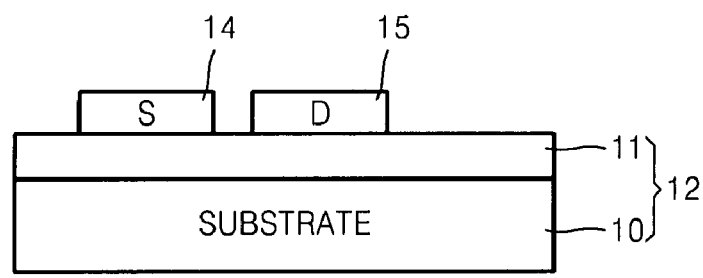

Referring to FIG. 5A, firstly, an insulating substrate 12 is prepared, and an electrode layer 13 is formed on insulating substrate 12. Insulating substrate 12 may include an Si substrate 10 and an $SiO_2$ insulating layer 11 formed on Si substrate 10. Alternatively, a glass substrate or a plastic substrate may be used as insulating substrate 12. And, electrode layer 13 is made from at least one material selected from the group consisting of Nb, Cr, Mo, W, Ti, Pt, Au, ITO, and Ag. After that, referring to FIG. 5B, electrode layer 13 is patterned so that a source electrode 14 and a drain electrode 15 can be formed and spaced apart from each other.

Figure 5C:
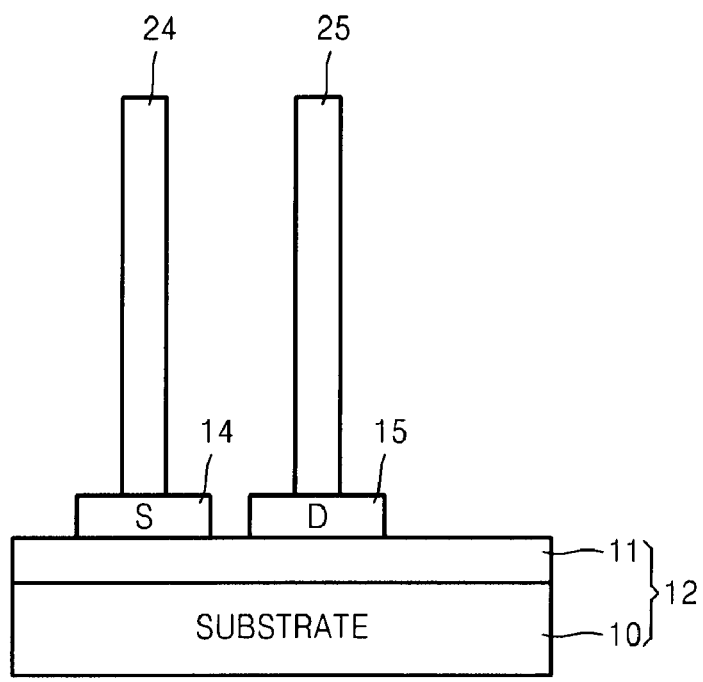

Referring to FIG. 5C, first and second nanowires 24 and 25 are vertically grown on source electrode 14 and drain electrode 15, respectively. Here, each of first and second nanowires 24 and 25 may be made from one material selected from the group consisting of a carbon-based material, a Pt-based material, a Si-based material, a GaN-based material, a GaAs-based material, and a ZnO-based material. For example, each of first and second nanowires 24 and 25 is made from one material selected from the group consisting of carbon fiber, carbon nanotubes (CNT), Pt, Si, GaN, GaAs, and ZnO. Each of first and second nanowires 24 and 25 may be formed to have a diameter of approximately 1 nm to 200 nm and a height of approximately 0.1 μm to 100 μm.

In order to facilitate growth of first and second nanowires 24 and 25, a catalyst may be further deposited on each of source electrode 14 and drain electrode 15 and then, first and second nanowires 24 and 25 may be grown on the catalyst. The catalyst may be made from at least one material selected from the group consisting of Ni, invar), Fe, Co, and Au.

Figure 5D:
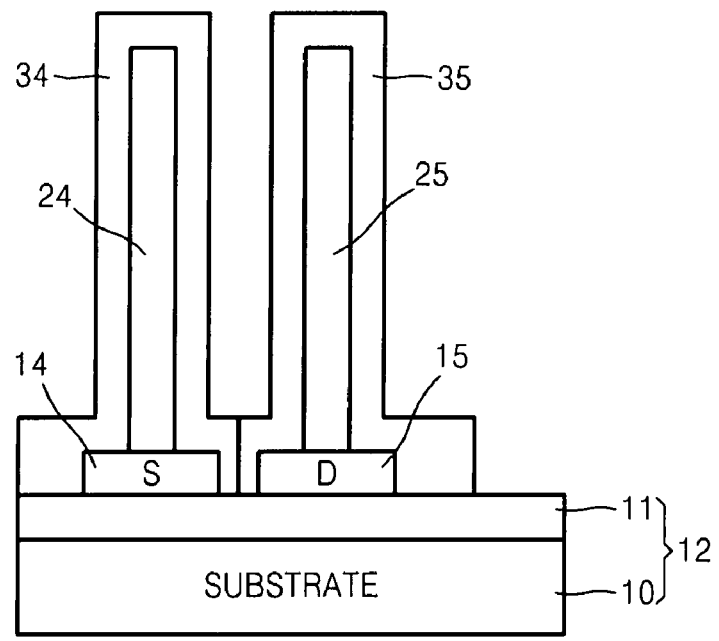

Then, referring to FIG. 5D, a first dielectric layer 34 surrounding source electrode 14 and first nanowire 24, and a second dielectric layer 35 surrounding drain electrode 15 and second nanowire 25 may be respectively formed on insulating substrate 12. First and second dielectric layers 34 and 35 may be simultaneously formed by an one-time deposition process. Each of first and second dielectric layers 34 and 35 may be formed to have a thickness of approximately 5 nm to 5000 nm and may be made from one material selected from the group consisting of $SiO_2$, $Si_3N_4$, $Ta_2O_5$, HfO, $SrTiO_3$, $(Ba,Sr)TiO_3$, $BaTiO_3$, and $Pb(Zr,Ti)O_3$. First and second dielectric layers 34 and 35 may be formed by plasma enhanced chemical vapor deposition (PECVD) or spin coating.

Figure 5E:
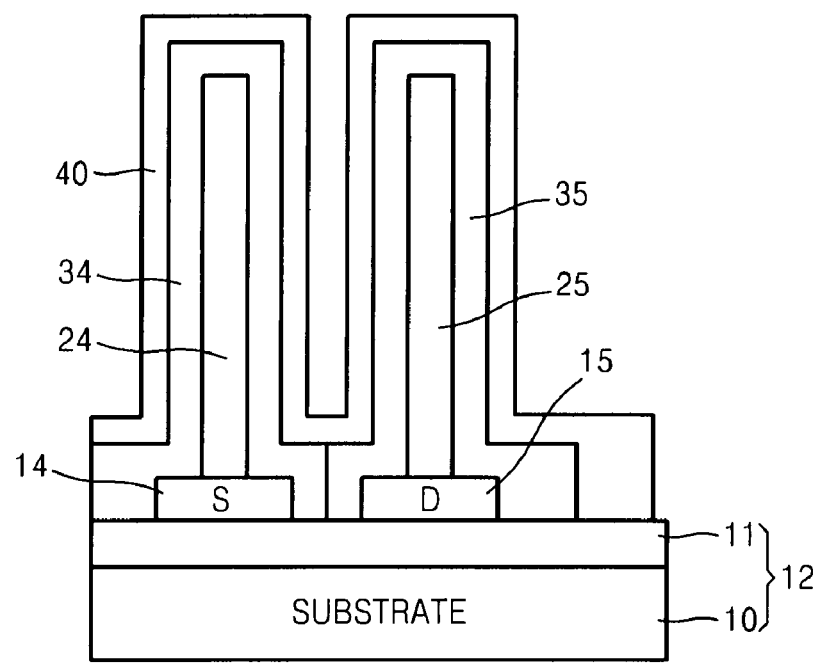
Figure 5F:
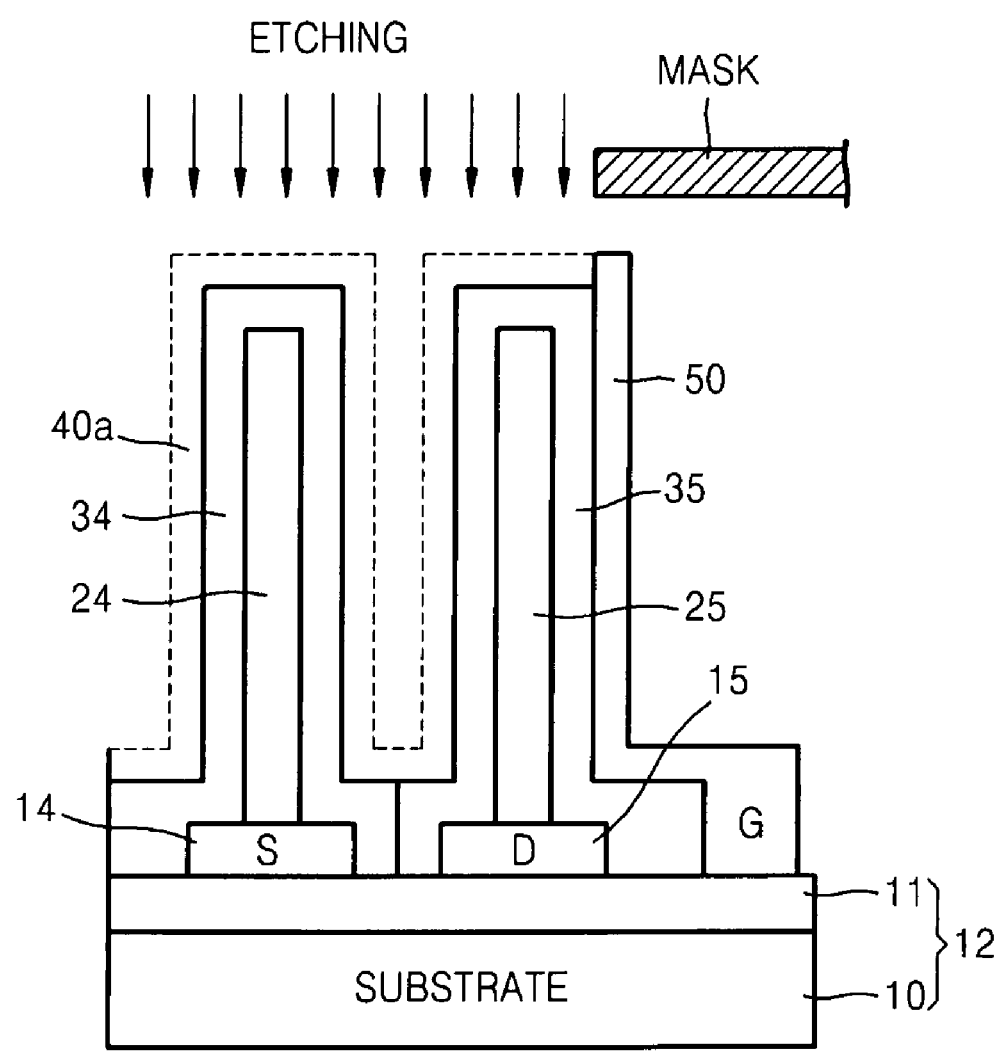
Figure 5G:
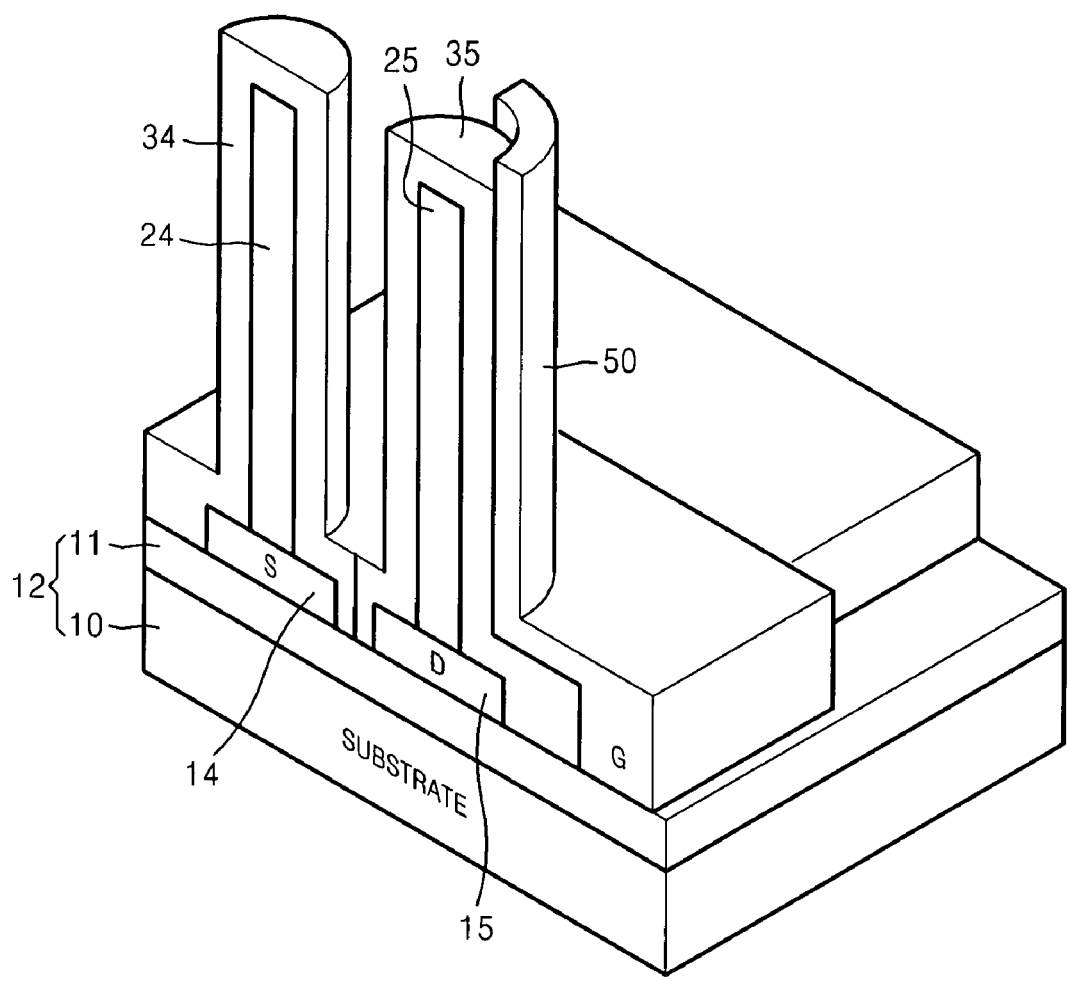
Figure 5H:
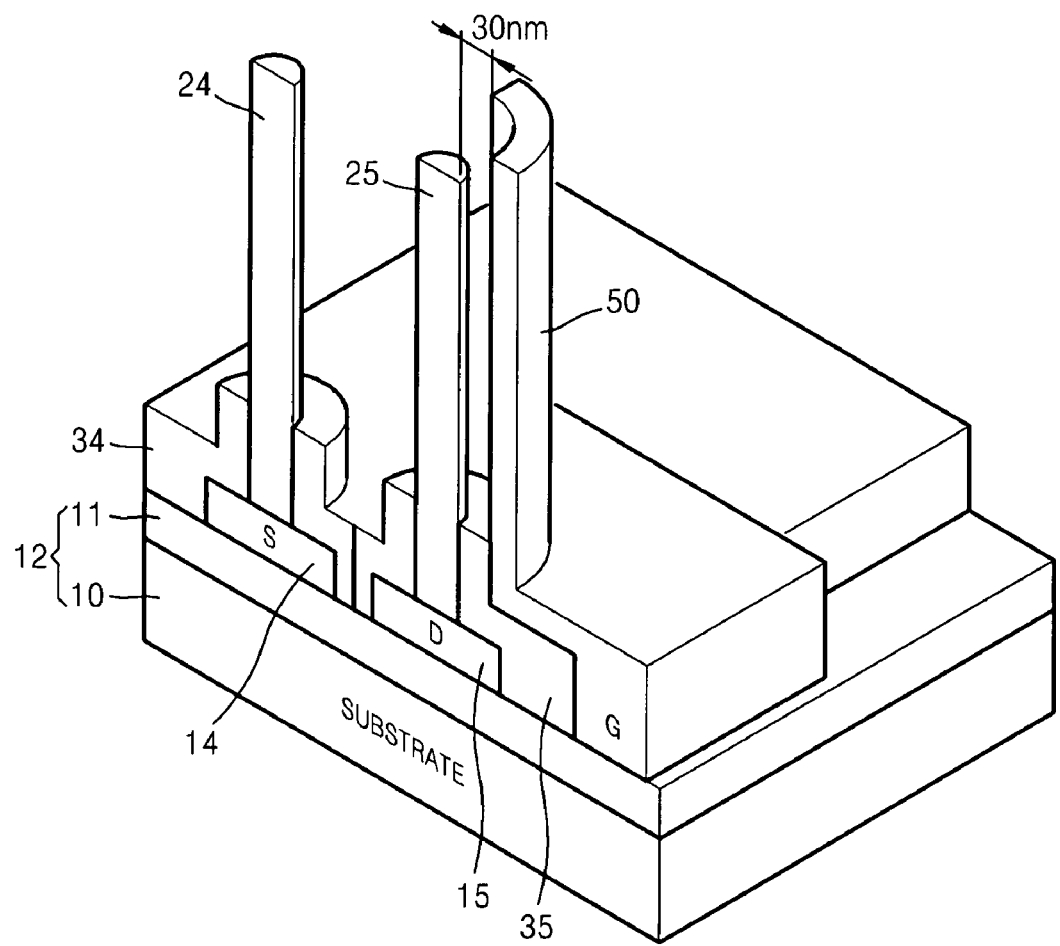

Referring to FIG. 5H, a gate electrode 50 is spaced apart from second nanowire 25, partially surrounding second nanowire 25 such that gate electrode 50 bears an opening that faces first nanowire 24 to avoid disturbing a mutual switching operation between first nanowire 24 and second nanowire 25 by gate electrode 50.

Specifically, firstly, referring to FIG. 5E, an electrode layer 40 made from at least one material selected from the group consisting of Nb, Cr, Mo, W, Ti, Pt, Au, ITO, and Ag is formed on first and second dielectric layers 34 and 35. Then, referring to FIG. 5F, a first region 40a which may disturb a mutual switching operation between first nanowire 24 and second nanowire 25, is selectively etched and removed, thereby forming gate electrode 50 in a structure in which a part that is facing first nanowire 24 is opened. Gate electrode 50 is formed as a half-cylinder type structure having a height of approximately 0.1 μm to 100 μm and may partially surround second nanowire 25.

Then, referring to FIG. 5G, after first region 40a of electrode layer 40 is removed and first and second dielectric layers 34 and 35 is exposed, an etchant is injected into the exposed surfaces of first and second dielectric layers 34 and 35 so that first and second dielectric layers 34 and 35 can be etched and removed. A buffered oxide etchant (BOE) such as a hydrofluoric acid (HF) solution may be used as the etchant.

Finally, referring to FIG. 5H, second dielectric layer 35 is removed so that gate electrode 50 and second nanowire 25 can be kept by a distance of approximately 5 nm to 5000 nm, and a blank space may be formed between gate electrode 50 and second nanowire 25. Thus, a space in which second nanowire 25 may be elastically deformed can be obtained. The distance between gate electrode 50 and second nanowire 25 may be controlled by adjusting the thickness of second dielectric layer 35.

The nanowire electromechanical switching device according to the present invention can be manufactured using the above process, and the process can be used to manufacture a memory device. When the nanowire electromechanical switching device according to the present invention is used in a memory device, an electromechanical memory device having a new structure which can replace an existing dynamic random access memory (DRAM) or static random access memory (SRAM) device, can be obtained. Hereinafter, the electromechanical memory device using the nanowire switching electromechanical device will be described.

Figure 6:
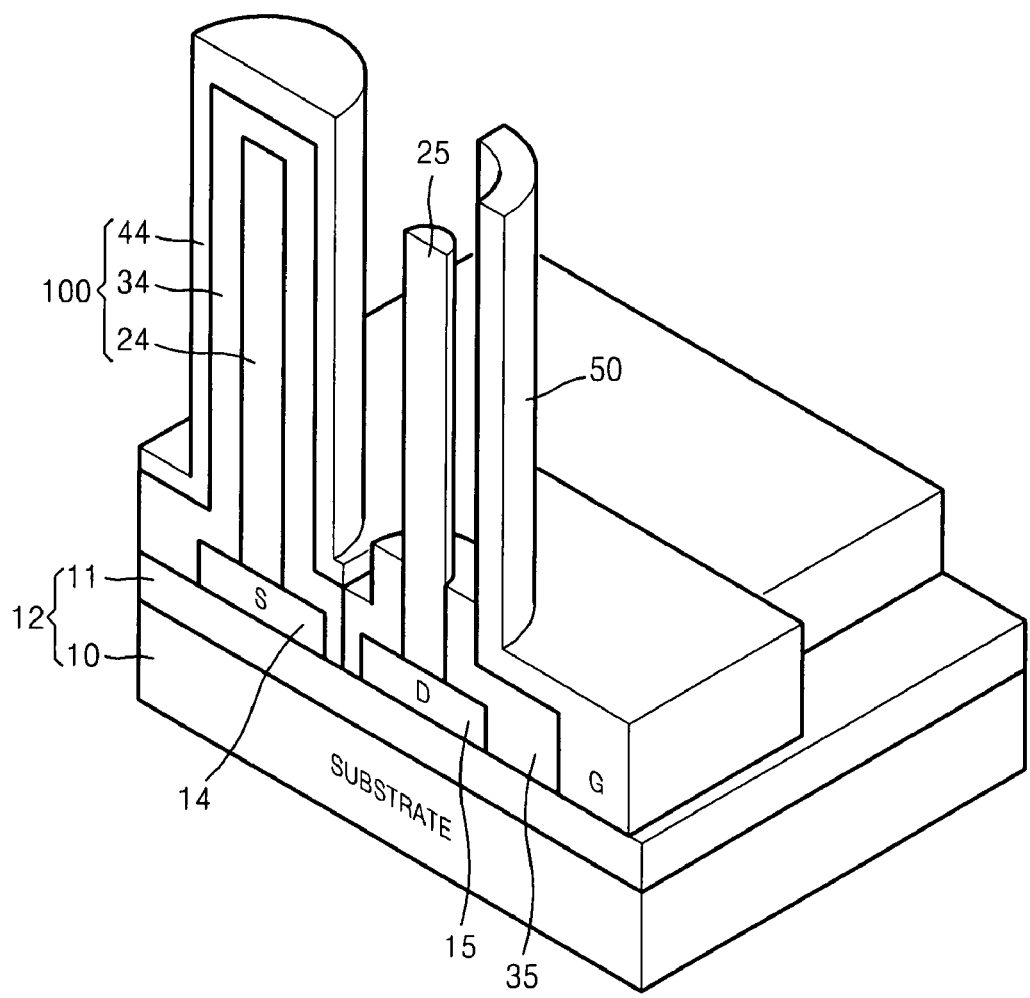
FIG. 6 is a schematic view of an electromechanical memory device constructed as an embodiment of the principles of the present invention.

FIG. 6 is a schematic view of the electromechanical memory device constructed as an embodiment of the principles of the present invention;

Referring to FIG. 6, the electromechanical memory device according to the principles of present invention is constructed with a source electrode 14, a drain electrode 15, and a gate electrode 50, which are formed on an insulating substrate 12, a nanowire capacitor 100 formed on source electrode 14, and a second nanowire 25 which is vertically grown on drain electrode 15 and may be either electromechanically connect with or disconnect from nanowire capacitor 100. Nanowire capacitor 100 includes a first nanowire 24 which is vertically grown on source electrode 14 and to which a $V_1$ voltage is applied, a first dielectric layer 34 which surrounds source electrode 14 and first nanowire 24, and a floating electrode 44 formed on an outer surface of first dielectric layer 34. Nanowire capacitor 100 in the electromechanical memory device according to the present invention may serve as a storage medium of charges.

Here, the $V_1$ voltage is applied to first nanowire 24, and a $V_2$ voltage having an opposite polarity to that of the $V_1$ voltage is applied to second nanowire 25. A glass substrate, a plastic substrate or a substrate designed to have other insulating characteristics may be used as insulating substrate 12. For example, insulating substrate 12 may includes an Si substrate 10 and an SiO$_2$ insulating layer 11 formed on Si substrate 10. Each of source electrode 14, drain electrode 15, gate electrode 50, and floating electrode 44 may be made from at least one material selected from the group consisting of Nb, Cr, Mo, W, Ti, Pt, Au, ITO, and Ag. And, first dielectric layer 34 may be formed to have a thickness of approximately 5 nm to 5000 nm and may be made from one material selected from the group consisting of SiO$_2$, Si$_3$N$_4$, Ta$_2$O$_5$, HfO, SrTiO$_3$, (Ba,Sr)TiO$_3$, BaTiO$_3$, and Pb(Zr,Ti)O$_3$.

Specifically, in the structure of the electromechanical memory device constructed according to the principles of the present invention, source electrode (S) 14 and drain electrode (D) 15 are disposed on insulating substrate 12 and are spaced apart from each other. In particular, gate electrode 50 is spaced apart from second nanowire 25, partially surrounds second nanowire 25 to have an opening facing nanowire capacitor 100 in order to avoid disturbing a mutual switching operation between nanowire capacitor 100 and second nanowire 25 by gate electrode 50. Gate electrode 50 may be formed as a half-cylinder type structure, having a height of approximately 0.1 μm to 100 μm. Gate electrode 50 is spaced apart from second nanowire 25 by a distance of approximately 5 nm to 5000 nm, and a $V_3$ voltage having the same polarity as that of the $V_2$ voltage is applied to gate electrode 50. Gate electrode 50 and drain electrode 15 are insulated from each other.

Each of first and second nanowires 24 and 25 may be made from one material selected from the group consisting of a carbon-based material, a Pt-based material, an Si-based material, a GaN-based material, a GaAs-based material, and a ZnO-based material. For example, each of first and second nanowires 24 and 25 is made from one material selected from the group consisting of carbon fiber, carbon nanotubes (CNT), Pt, Si, GaN, GaAs, and ZnO. Each of first and second nanowires 24 and 25 may be formed to have a diameter of approximately 1 nm to 200 nm and a height of approximately 0.1 μm to 100 μm.

In the electromechanical memory device according to the principles of the present invention, when the $V_1$, $V_2$, and $V_3$ voltages are applied to first and second nanowires 24 and 25 and gate electrode 50, respectively, electrostatic force may be induced between first and second nanowires 24 and 25, and gate electrode 50. Specifically, an attractive force may be induced between first and second nanowires 24 and 25, and a repulsive force may be induced between second nanowire 25 and gate electrode 50. Thus, second nanowire 25 may be elastically deformed by the electrostatic force, that is, may be bent and may contact nanowire capacitor 100, and the electromechanical memory device is switched on. And, when at least one of the $V_1$, $V_2$, and $V_3$ voltages is removed, second nanowire 25 is restored to its original state by an elastic restoration force, and the electromechanical memory device is switched off. Thus, by adjusting magnitudes of the $V_1$, $V_2$, and $V_3$ voltages, second nanowire 25 can either contact nanowire capacitor 100 or disconnect from nanowire capacitor 100, so that the electromechanical memory device can be either switched on or switched off. And, data may be stored in nanowire capacitor 100, or alternatively, data stored in nanowire capacitor 100 may be read by performing the on and off switching operation.

According to the present invention, the electromechanical memory device which can replace an existing DRAM device, can be obtained. In particular, in the electromechanical memory device according to the present invention, on and off states are clearly distinguished from each other using mechanical movement of the nanowires so that stable switching characteristics can shown and leakage current can be minimized. Thus, a driving voltage of the memory device can be reduced and high mobility and high performance compared to an existing DRAM device can be implemented.

Hereinafter, an operation of writing and reading data in the memory device according to the principles of the present invention will be described in details with reference to the drawings.

FIGS. 7A through 7D are schematic views illustrating a data writing and reading operation of an electromechanical memory device according to an embodiment of the present invention.

Figure 7A:
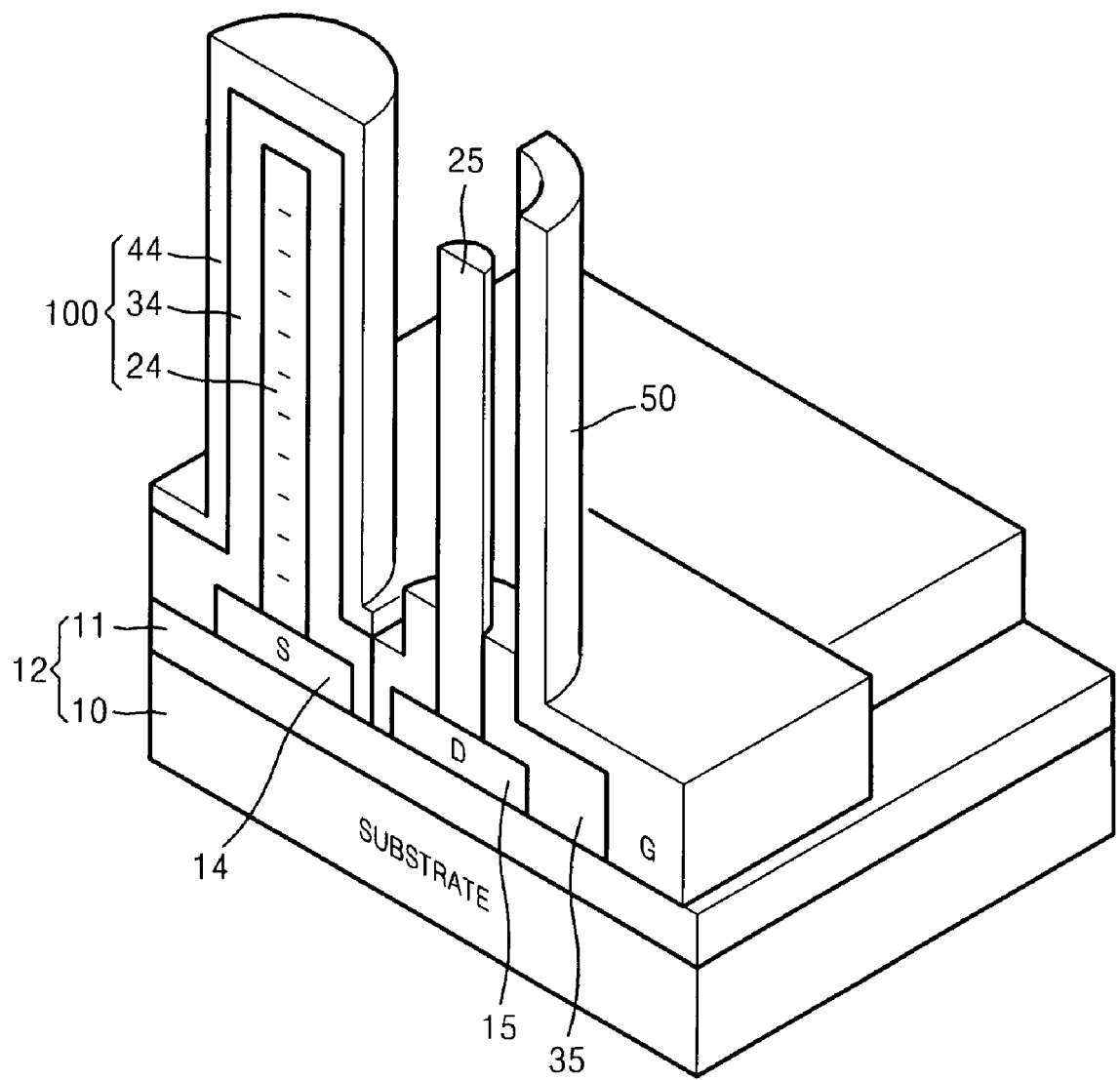
FIGS. 7A through 7D are schematic views illustrating a data writing/reading operation of an electromechanical memory device according to an embodiment of the principles of the present invention.
Figure 7B:
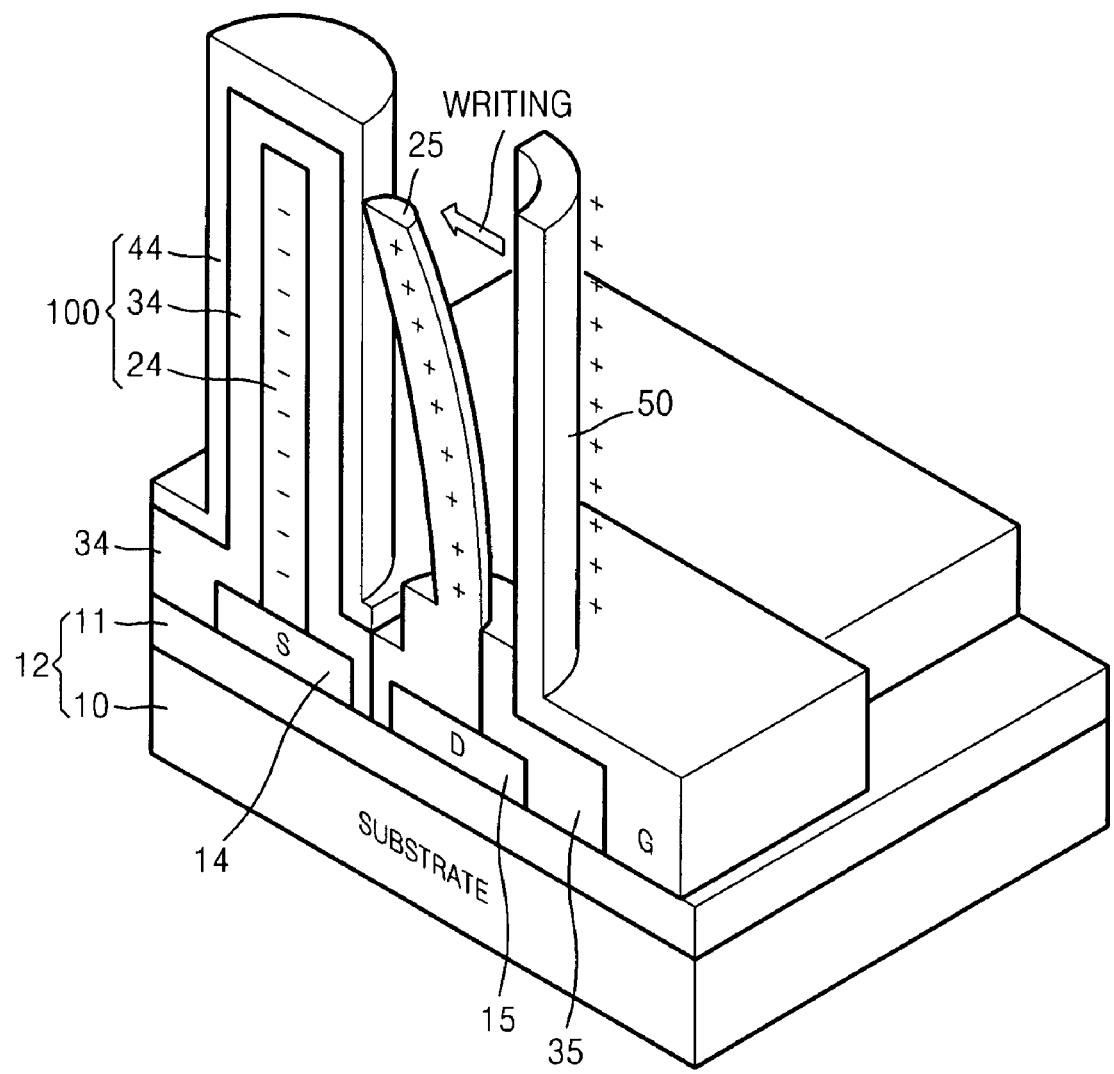

Referring to FIGS. 7A and 7B, in the memory device of FIG. 6, when voltages $V_1$ having a negative polarity ("−"), $V_2$ having a positive polarity ("+"), and $V_3$ having a positively polarity ("+") are applied to first and second nanowires 24 and 25 and gate electrode 50, respectively, second nanowire 25 is elastically deformed by an electrostatic force, contacts nanowire capacitor 100 and the memory device is in a switching on state. Therefore, charges are stored in nanowire capacitor 100.

Figure 7C:
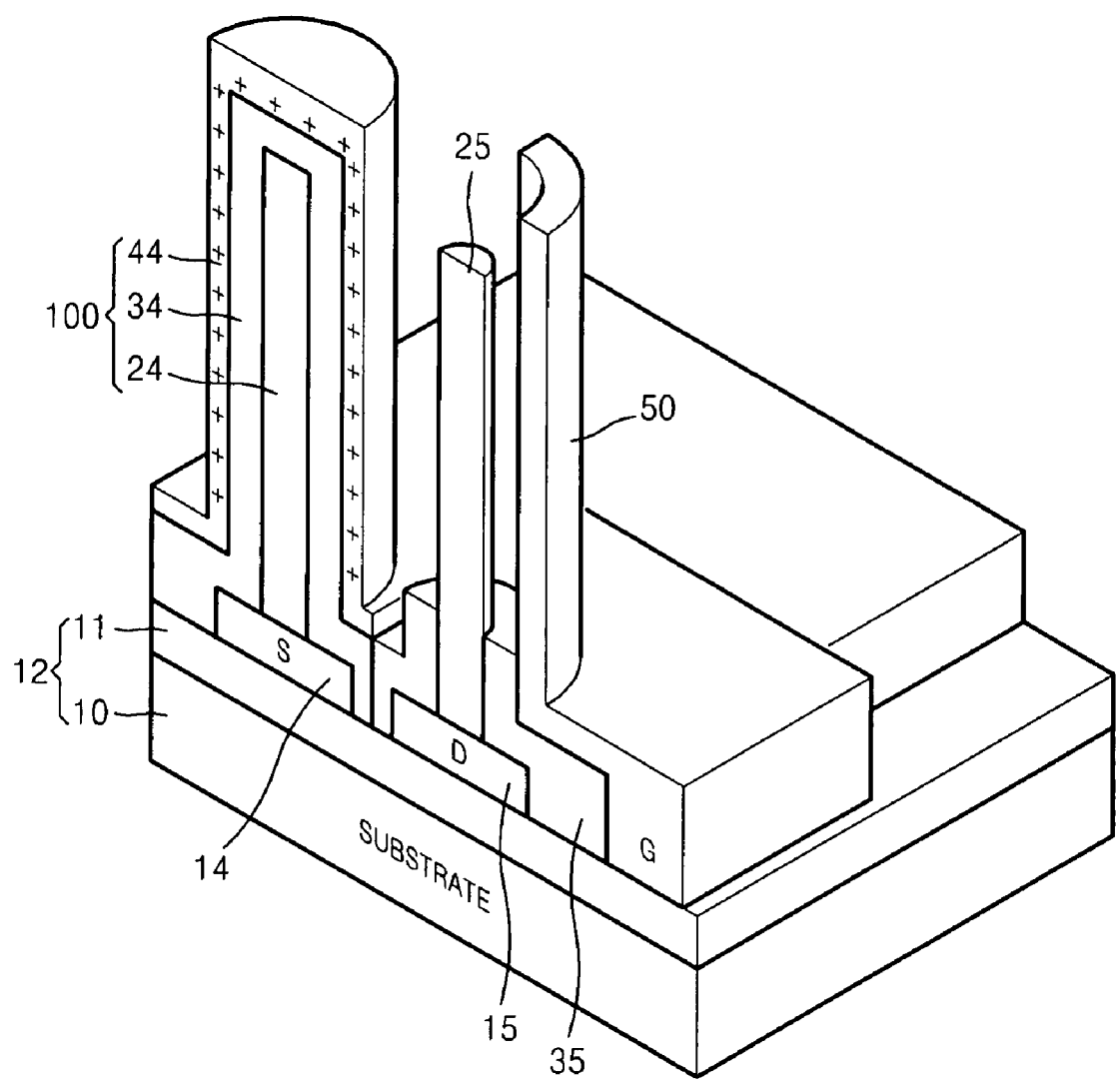

Referring to FIG. 7C, when $V_2$ and $V_3$ voltages are removed from second nanowire 25 and gate electrode 50, respectively, second nanowire 50 is restored to its original state, and "+" charges remain in floating electrode 44. Therefore, nanowire capacitor 100 remains in a state in which charges are stored, that is, in an information storage state ("1" state).

Figure 7D:
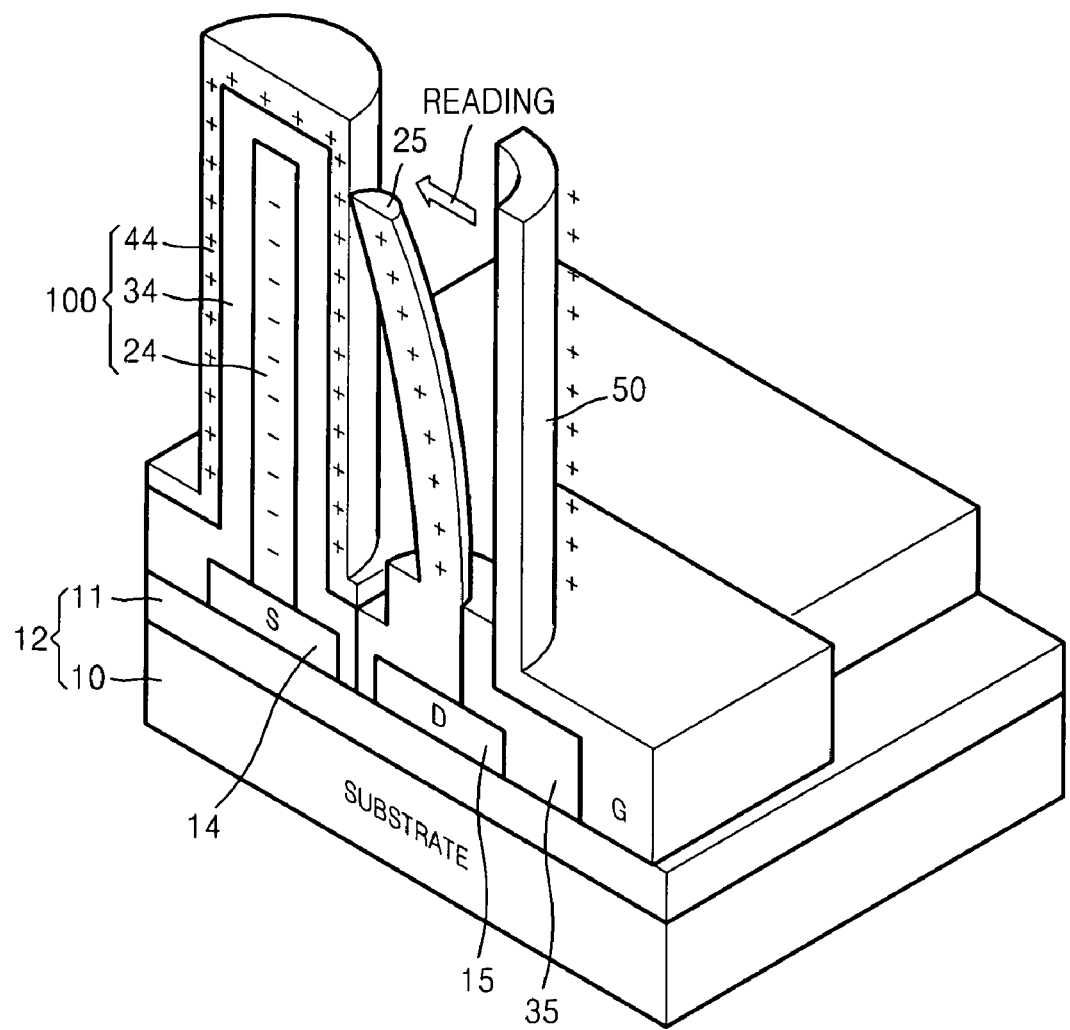

Referring to FIG. 7D, by applying $V_1$ ("−"), $V_2$ ("+"), and $V_3$ ("+") voltages to first and second nanowires 24 and 25 and gate electrode 50, respectively, the memory device is driven in a reading process and data stored in nanowire capacitor 100 can be read. Specifically, in the reading process, the amount of current that flows between nanowire capacitor 100 and second nanowire 25 when "+" charges are stored in nanowire capacitor 100 (the "1" state), and the amount of current that flows between nanowire capacitor 100 and second nanowire 25 when "+" charges are not stored in nanowire capacitor 100 (an "0" state), are different from each other. For example, during the reading process, in the case of the "1" state, "+" charges have been already stored in floating electrode 44, and "+" charges accumulate in second nanowire 25, and therefore a repulsive force is induced between floating electrode 44 and second nanowire 25. Due to the repulsive force between floating electrode 44 and second nanowire 25, second nanowire 25 does not contact nanowire capacitor 100, and thus no current flows between nanowire capacitor 100 and second nanowire 25. Even through the accumulated "+" charges in nanowire capacitor 100 leak from nanowire capacitor 100, or gate bias $V_3$ of gate electrode 50 is sufficiently high so that second nanowire 25 contacts nanowire capacitor 100, a smaller amount of current than in the "0" state flows between nanowire capacitor 100 and second nanowire 25 due to the repulsive force between floating electrode 44 and second nanowire 25. Thus, whether data is stored in the nanowire capacitor 100 can be known from the difference in the amount of current.

Figure 8A:
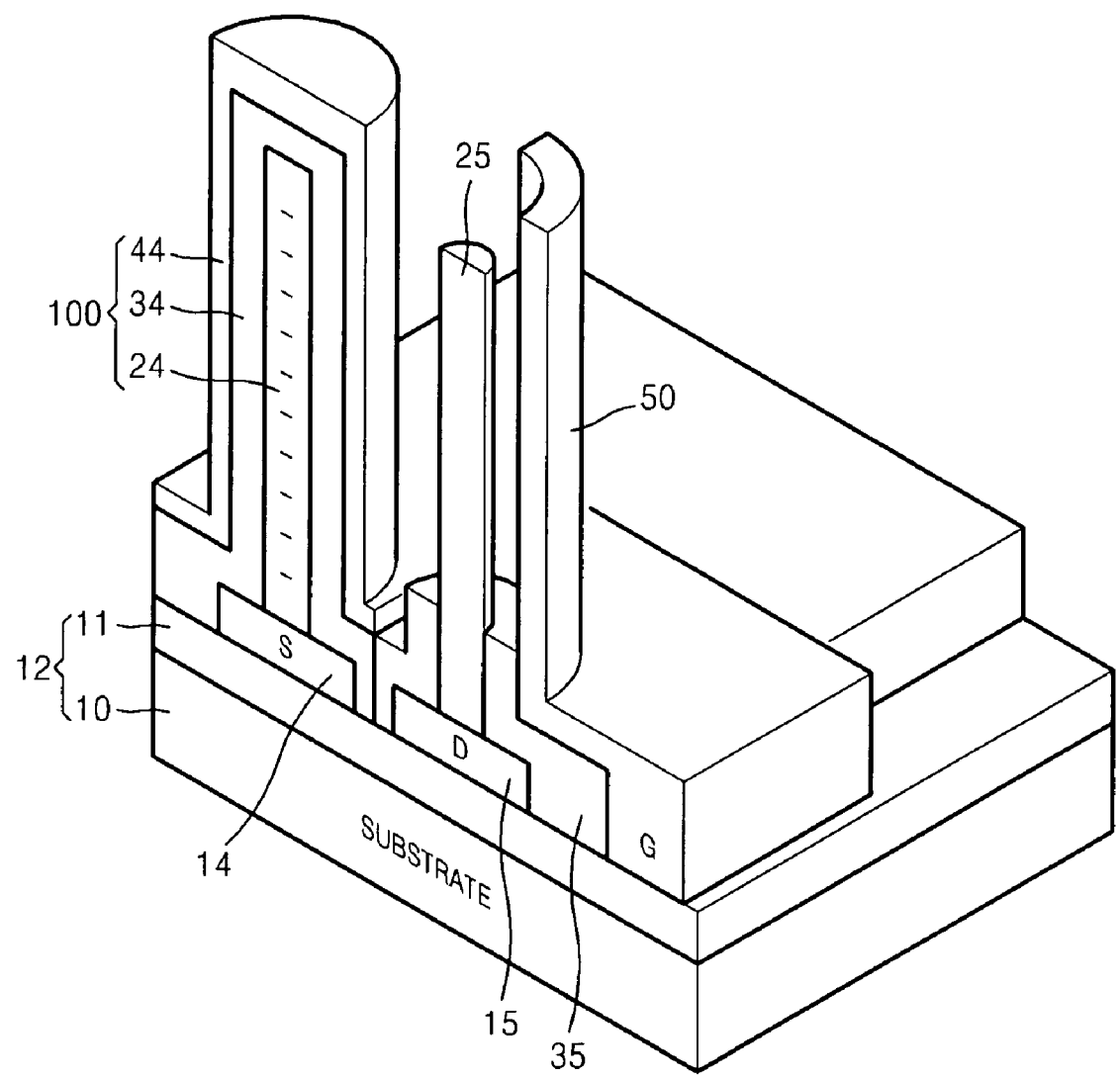
FIGS. 8A through 8D are schematic views illustrating a data writing/reading operation of an electromechanical memory device according to another embodiment of the principles of the present invention.
Figure 8B:
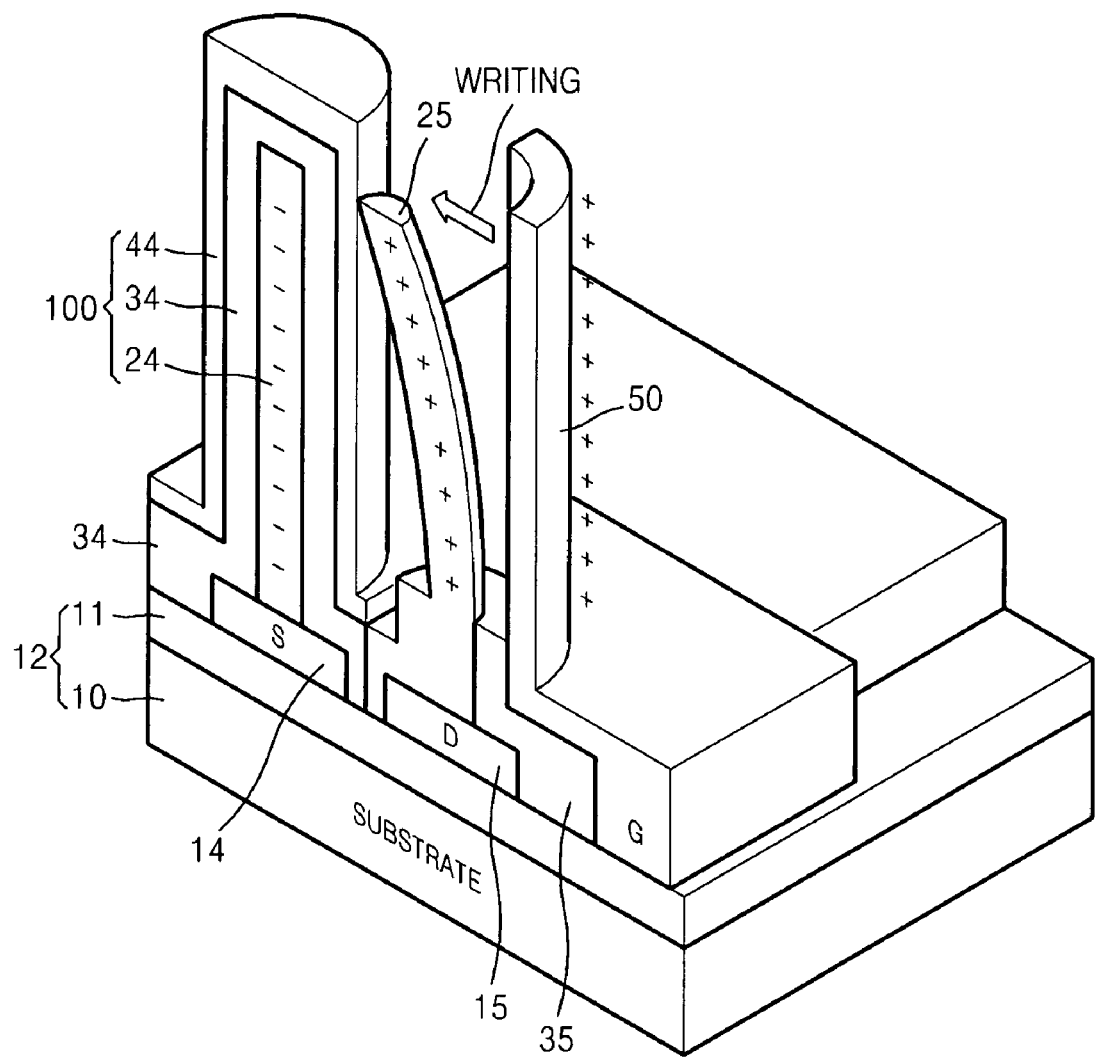
Figure 8C:
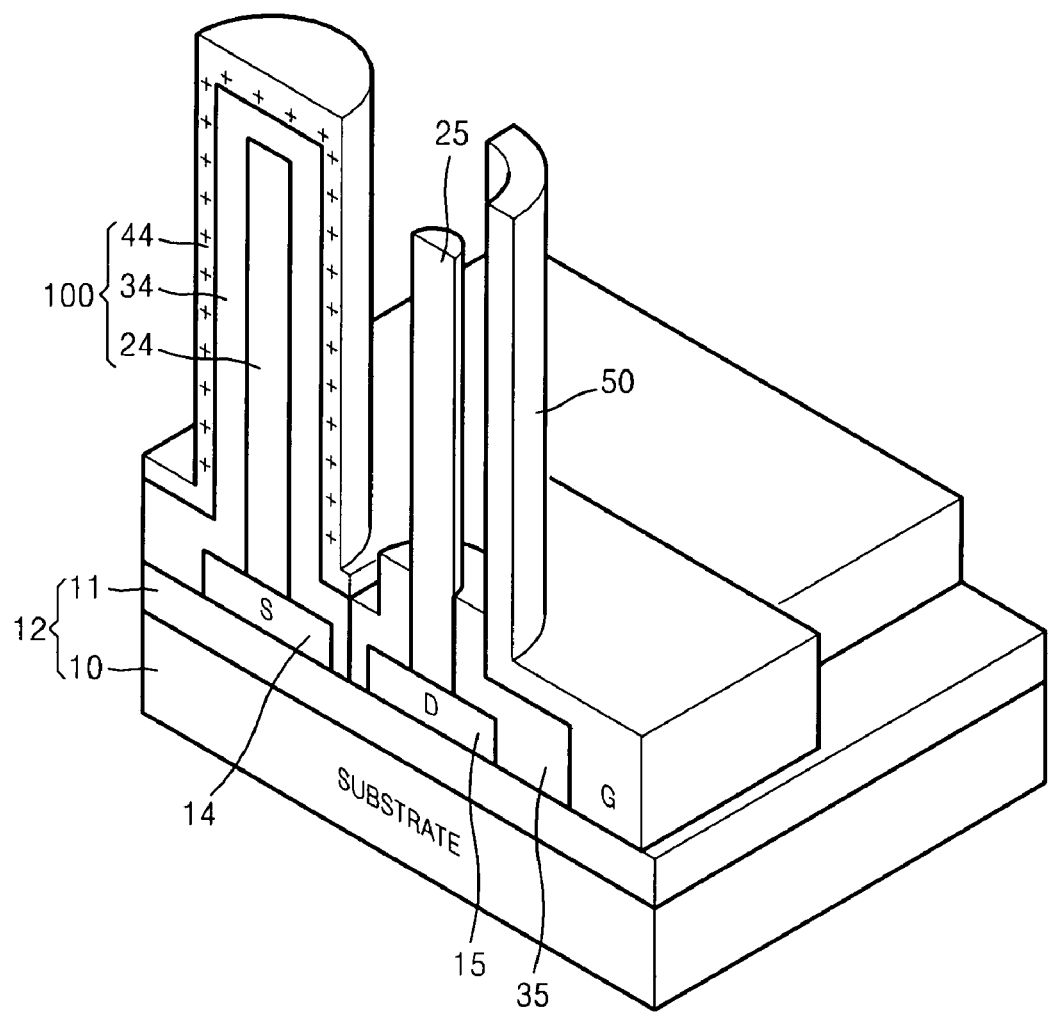

FIGS. 8A through 8D are schematic views illustrating a data writing and reading operation of an electromechanical memory device according to another embodiment of the principles of the present invention. FIGS. 8A through 8C have the same data writing operation as that illustrated in FIGS. 7A through 7C and thus, repeated descriptions thereof will be omitted.

Figure 8D:
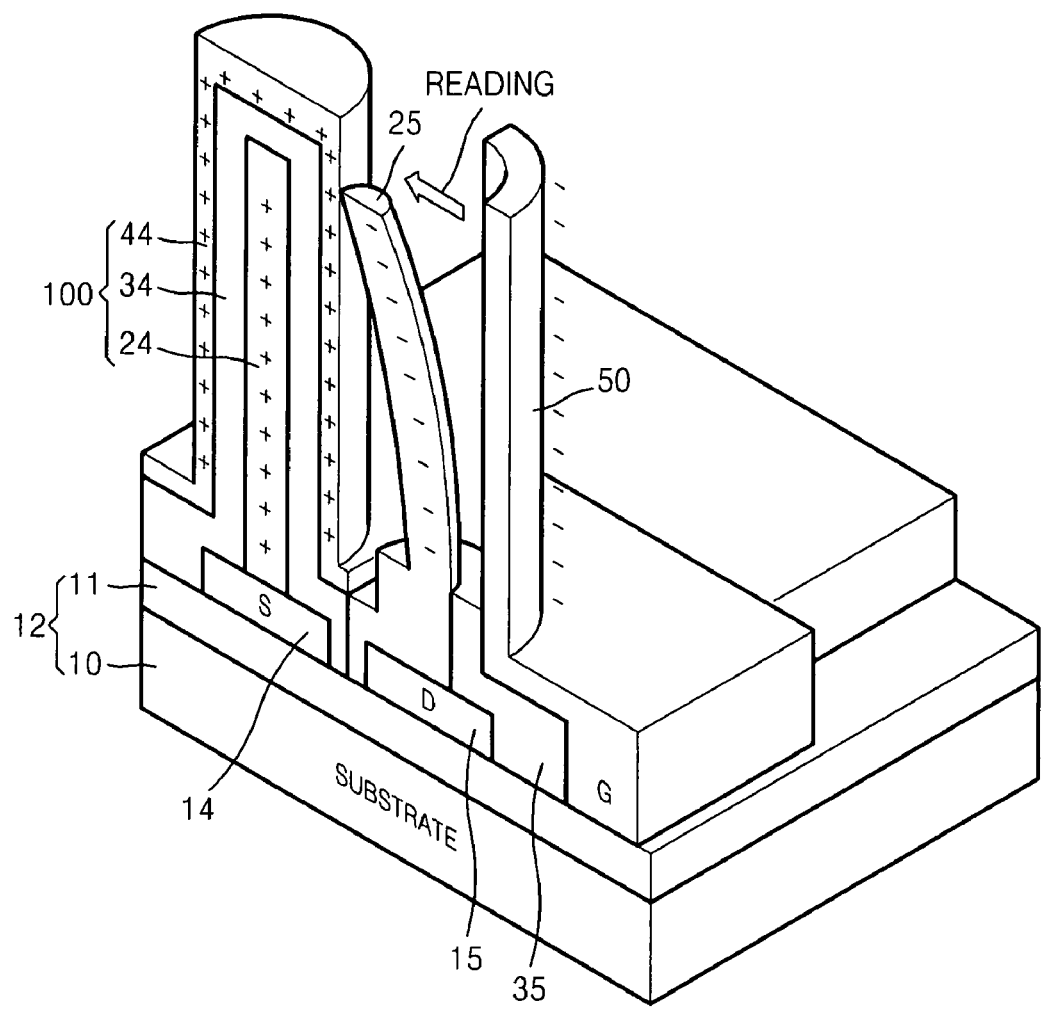

Referring to FIG. 8D, when the memory device is again driven in the switching on state, voltages having opposed polarities to those when the memory device is initially driven in the switching on state, are applied to first and second nanowires 24 and 25 and gate electrode 50, respectively. For example, $V_1$ ("+"), $V_2$ ("−"), and $V_3$ ("−") voltages are applied to first and second nanowires 24 and 25 and gate electrode 50, respectively, so that the memory device is driven in the switching on state. Even in this case, like in the data writing and reading operation illustrated in FIG. 7D, the amount of current which that flows between nanowire capacitor 100 and second nanowire 25 when information is stored in nanowire capacitor 100 (the "1" state), and the amount of current that flows between nanowire capacitor 100 and second nanowire 25 when information is not stored in nanowire capacitor 100 (an "0" state), are different from each other. Thus, the data stored in nanowire capacitor 100 (the "1" state) can be read from the difference in the amount of current. For example, in the case of the "1" state, since "+" charges have been already stored in nanowire capacitor 100, a larger amount of current than in the "0" state flows so that "+" charges stored in nanowire capacitor 100 can be offset by $V_2$("−"). Thus, whether data is stored in nanowire capacitor 100 can be known from the difference in the amount of current.

FIGS. 9A through 9H illustrate a method for manufacturing an electromechanical memory device according to an embodiment of the principles of the present invention. Here, processes of FIGS. 9A through 9D are the same as those of FIGS. 5A through 5D and thus, repeated descriptions thereof will be omitted.

By performing processes of FIGS. 9A through 9D, first dielectric layer 34 which surrounds source electrode 14 and first nanowire 24, and second dielectric layer 35 which surrounds drain electrode 15 and second nanowire 25, are respectively formed on an insulating substrate 12.

Figure 9A:
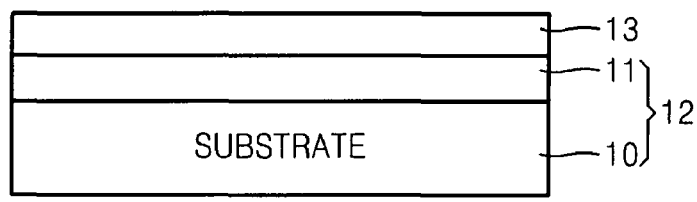
FIGS. 9A through 9H illustrate a method for manufacturing an electromechanical memory device according to an embodiment of the principles of the present invention.
Figure 9B:
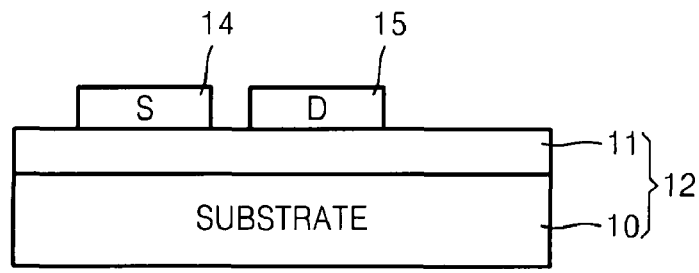
Figure 9C:
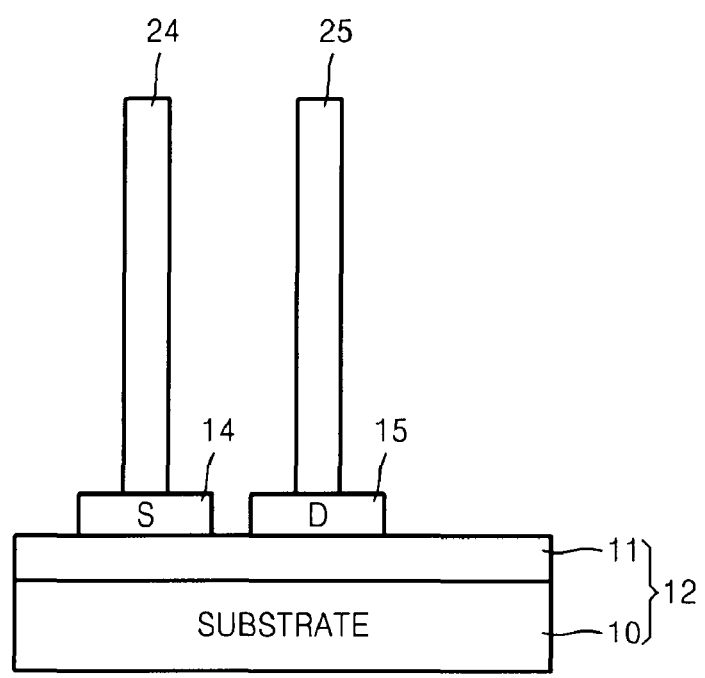
Figure 9D:
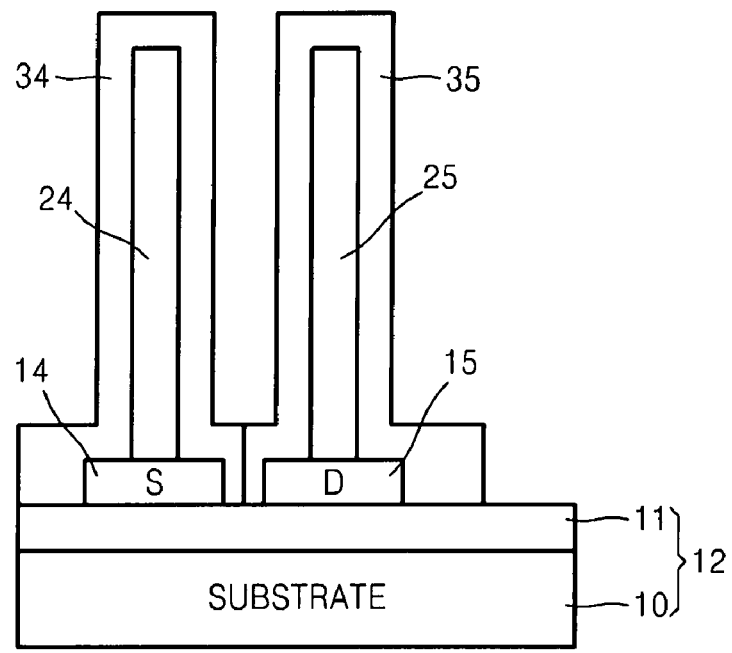
Figure 9E:
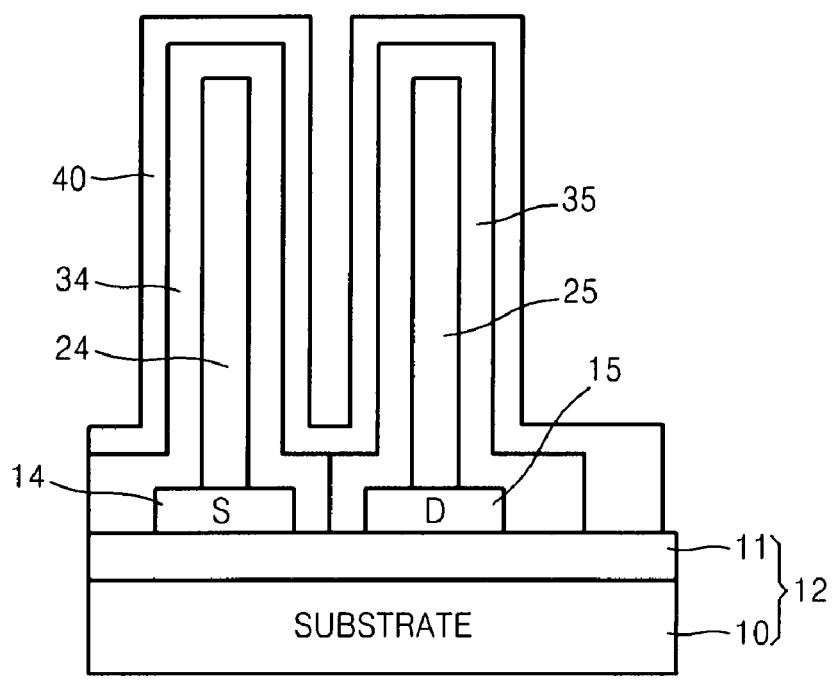
Figure 9F:
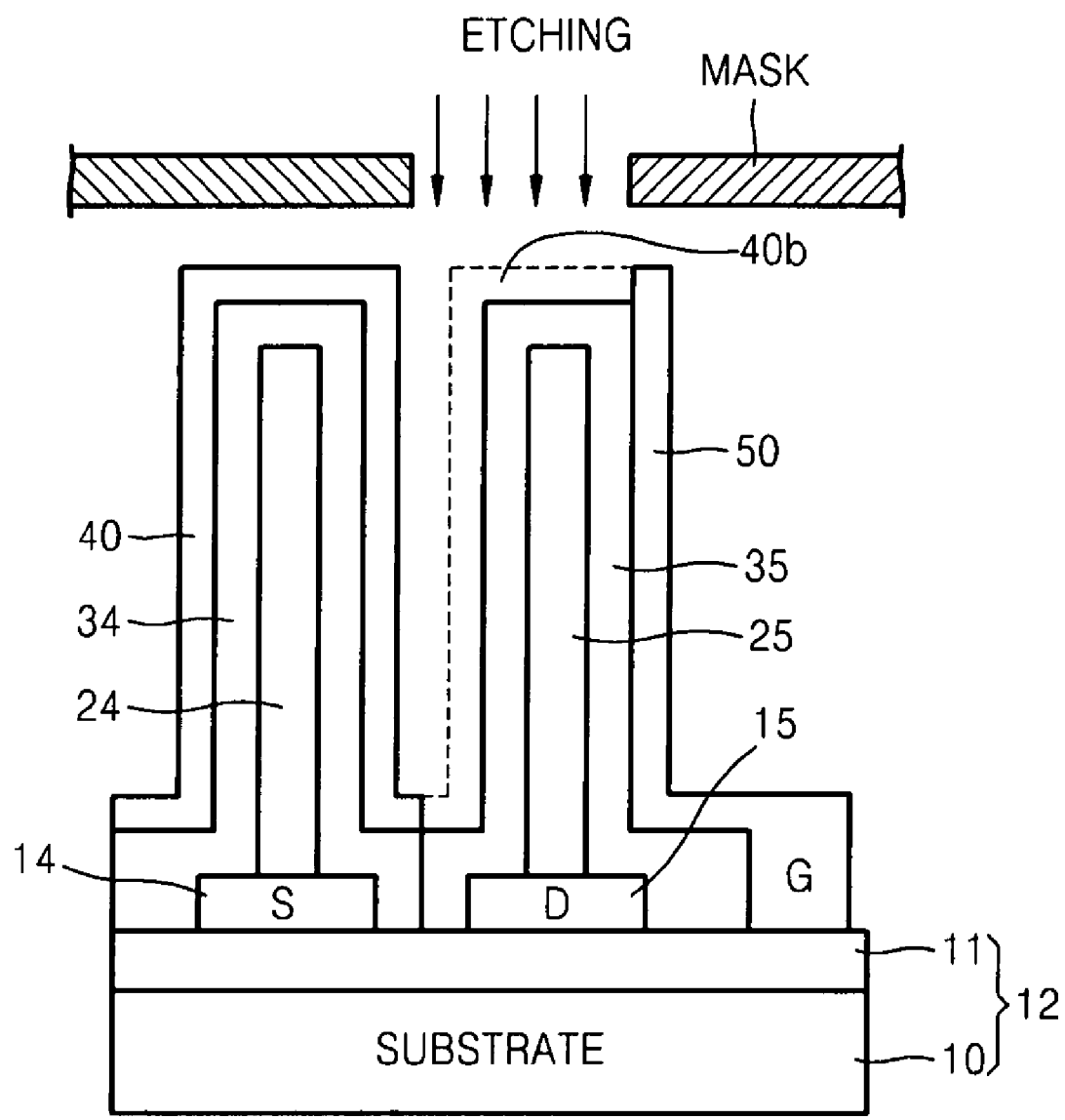

Referring to FIGS. 9E and 9F, firstly, an electrode layer 40 is formed on first and second dielectric layers 34 and 35 using at least one material selected from the group consisting of Nb, Cr, Mo, W, Ti, Pt, Au, ITO, and Ag. Then, a second region 40b which may disturb a switching operation of second nanowire 25, is selectively etched and removed from electrode layer 40, thereby forming a gate electrode 50 having an opening that faces nanowire capacitor 100. Gate electrode 50 is formed as a half-cylinder type structure having a height of approximately 0.1 μm to 100 μm and may partially surround second nanowire 25. In addition, second region 40b is selectively removed so that a floating electrode 44 can be formed on first dielectric layer 34, and floating electrode 44, first nanowire 24 and first dielectric layer 34 can constitute nanowire capacitor 100.

Figure 9G:
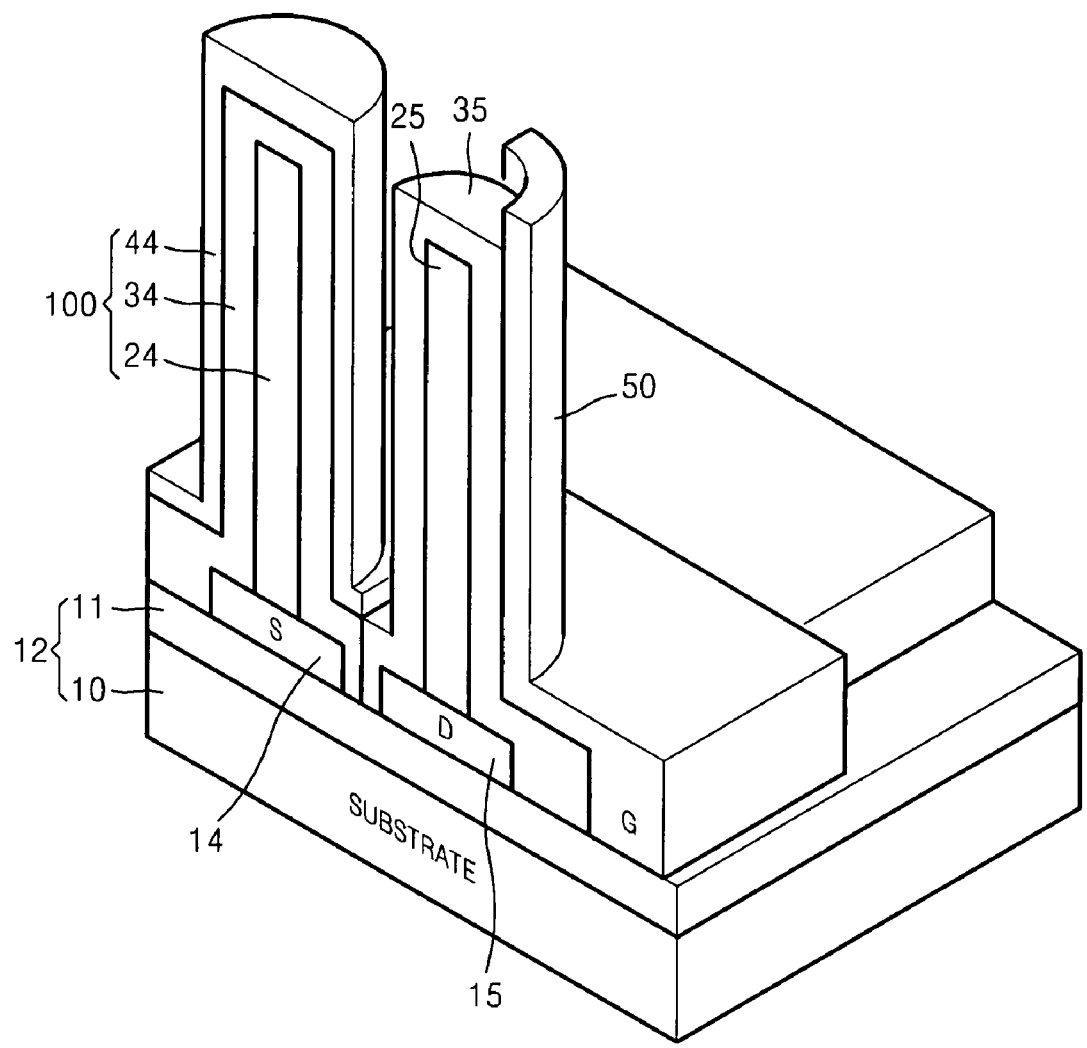
Figure 9H:
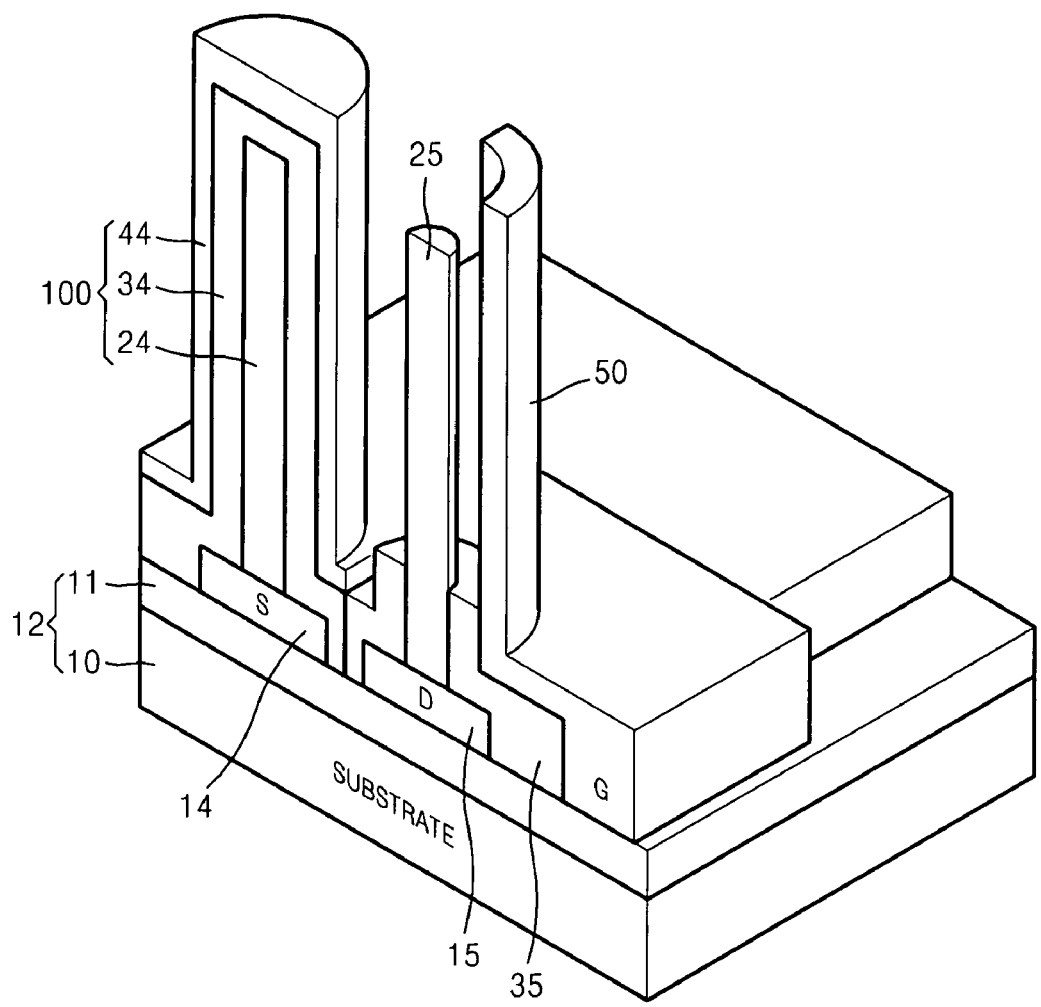

Referring to FIGS. 9G and 9H, after second region 40b of electrode layer 40 is removed so that second dielectric layer 35 can be exposed, an etchant is injected into the exposed surface of second dielectric layer 35 so that second dielectric layer 35 can be etched and removed. A buffered oxide etchant (BOE) such as a hydrofluoric acid (HF) solution may be used as the etchant. Second dielectric layer 35 is removed so that gate electrode 50 and second nanowire 25 can be kept by a spaced distance of approximately 5 nm to 5000 nm, and a blank space may be formed between gate electrode 50 and second nanowire 25. Thus, a space in which second nanowire 25 may be elastically deformed can be obtained. The distance between gate electrode 50 and second nanowire 25 may be controlled by adjusting the thickness of second dielectric layer 35. The electromechanical memory device according to the principles of the present invention can be manufactured through the process.

Figure 10A:
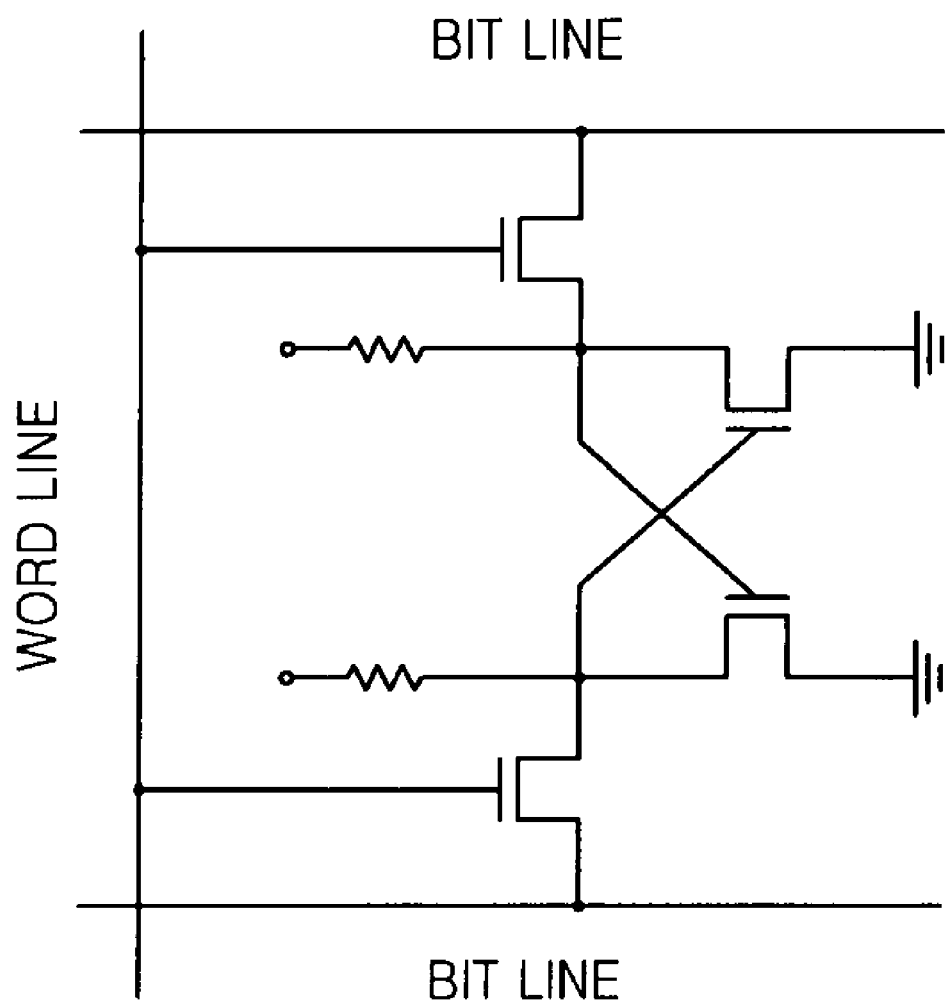
FIG. 10A is a circuit diagram of a contemporary static random access memory (SRAM) device and FIG. 10B is a circuit diagram of an SRAM device using a nanowire electromechanical switching device according to principles of the present invention.
Figure 10B:
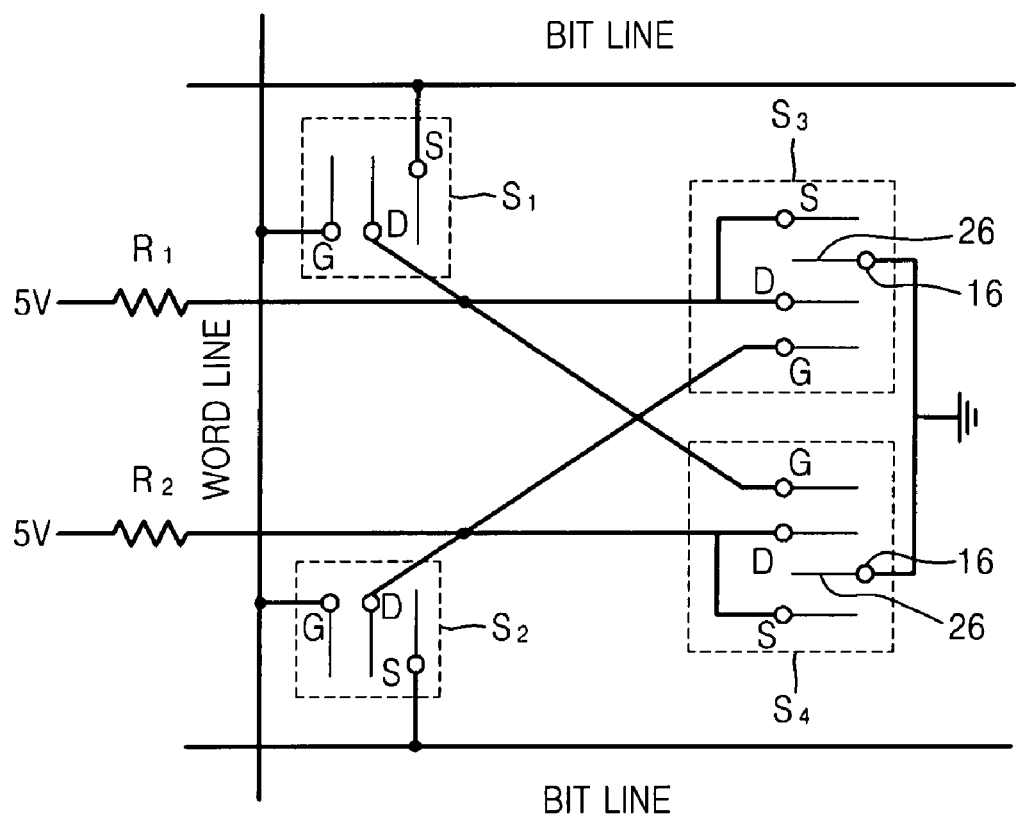

FIG. 10A is a circuit diagram of a contemporary SRAM device and FIG. 10B is a circuit diagram of an SRAM device using a nanowire electromechanical switching device according to the present invention.

Static random access memory (SRAM) is a memory device in which information is always memorized by the SRAM once the information is stored while power is supplied to the SRAM. A contemporary single unit memory device includes four switching devices and two resistances. Contemporarily, a transistor is used as the switching device.

The circuit diagram of an SRAM device including four transistors and two load resistances connected in a manner of a flip-flop having a latch structure is shown in FIG. 10A. The operation and structure of the SRAM device having the above structure haven been already well-known and thus, detailed descriptions thereof will be omitted.

According to the present invention, a transistor that has been used as a contemporary switching device is replaced with the nanowire electromechanical switching device according to the present invention so that an SRAM device having a new structure including a nanowire electromechanical switching device and a resistance can be implemented. And, the circuit diagram of the SRAM device according to the present invention is shown in FIG. 10B.

In the SRAM device according to the present invention, the structure and operation of the nanowire electromechanical switching device and the method for manufacturing the same have been already described. Thus, repeated descriptions thereof will be omitted. Referring to FIG. 10B, the SRAM device according to the present embodiment of the present invention includes four nanowire electromechanical switching devices $S_1$, $S_2$, $S_3$, and $S_4$ and two load resistors $R_1$ and $R_2$. Specifically, the SRAM device according to the present embodiment of the present invention includes first and second switching devices $S_1$ and $S_2$ connected to bit lines, and third and fourth switching devices $S_3$ and $S_4$ connected to two load resistances $R_1$ and $R_2$, respectively. Here, the third and fourth switching devices are connected in a latch structure $S_3$ and $S_4$. Here, each of the first, second, third, and fourth switching devices $S_1$, $S_2$, $S_3$, and $S_4$ uses the nanowire electromechanical switching device according to the present invention.

Each of the third and fourth switching devices $S_3$ and $S_4$ may further include a ground electrode 16, and a third nanowire 26 which is vertically grown on ground electrode 16. Ground electrode 16 may be disposed between a source electrode and a drain electrode, and third nanowire 26 formed on ground electrode 16 may either connect with or disconnect from first and second nanowires 24 and 25 when first and second nanowires 24 and 25 are either connected or disconnected. A material used in forming ground electrode 16 and a method for forming the ground electrode are the same as a material used in forming source and drain electrodes 14 and 15 and a method for forming source and drain electrodes 14 and 15. Similarly, a material used in forming second nanowire 26 and a method for forming second nanowire 26 are the same as a material used in forming first and second nanowires 24 and 25 and a method for forming first and second nanowires 24 and 25. Thus, repeated descriptions thereof will be omitted.

According to the present invention, a nanowire electromechanical switching device having stable on and off switching characteristics in which a burning phenomenon between two nanowires where the nanowires contact each other does not occur, and having low-voltage driving characteristics, can be obtained. In particular, according to the present invention, a manufacturing technique for the nanowire electromechanical switching device in which a distance between the nanowires and the gate electrode is very narrow, is provided such that the efficiency of an electrostatic force induced between the first and second nanowires and the gate electrode is maximized and a driving voltage of the electromechanical switching device is reduced to be less than 5 V. The nanowire electromechanical switching device according to the present invention has excellent switching characteristics, high mobility, and high performance compared to a contemporary silicon transistor, can be manufactured to have a nano size and thus can be ultra-highly integrated.

In addition, when the nanowire electromechanical switching device according to the present invention is used in a memory device, an electromechanical memory device having a new structure which can replace an existing DRAM or SRAM device, can be obtained. In particular, in the electromechanical memory device according to the present invention, on and off states are clearly distinguished from each other using mechanical movement of the nanowires so that stable switching characteristics can be achieved and leakage current can be minimized. Thus, a driving voltage of the memory device can be reduced and high mobility and high performance compared to an existing DRAM device can be implemented. In addition, the structure of the electromechanical memory device according to the present invention is very simple and a process of manufacturing the same is easy such that reproducibility and reliability of the manufactured device are high.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A static random access memory (SRAM) device, the device comprising:
   first and second switching devices connected to bit lines; and
   third and fourth switching devices respectively connected to two load resistors, the third and fourth switching devices being connected in a latch structure, and each of the first, second, third, and fourth switching devices comprising:
   a source electrode and a drain electrode disposed on an insulating substrate and spaced apart from each other;
   a first nanowire vertically grown on the source electrode, and to which a $V_1$ voltage is applied;
   a second nanowire vertically grown on the drain electrode, and to which a $V_2$ voltage having an opposite polarity to that of the $V_1$ voltage; and
   a gate electrode spaced apart from the second nanowire, partially surrounding the second nanowire and having an opening that faces the first nanowire to avoid disturbing a mutual switching operation of the first nanowire and the second nanowire, and to which a $V_3$ voltage having the same polarity as that of the $V_2$ voltage is applied, by an action between an electrostatic force between both of the first and second nanowires and the gate electrode and an elastic restoration force of the second nanowire, the first and second nanowires either contact or disconnect from each other so that the switching device is either switched on or switched off.

2. The SRAM device of claim 1, with each of the third and fourth switching devices further comprising a ground electrode and a third nanowire vertically grown on the ground electrode.

3. The SRAM device of claim 2, with the ground electrode being disposed between the source electrode and the drain electrode.

4. The SRAM device of claim 3, with, in each of the third and fourth switching devices, the first and second nanowires either contact or disconnect from the third nanowire so that the switching device is either switched on or off.

5. The SRAM device of claim 1, with the gate electrode being formed as a half-cylinder type structure.

6. The SRAM device of claim 1, with the gate electrode and the second nanowire being spaced apart from each other by a distance of approximately 5 nm to approximately 5000 nm.

7. The SRAM device of claim 1, with each of the source electrode, the drain electrode, and the gate electrode being made from at least one material selected from the group consisting of Nb, Cr, Mo, W, Ti, Pt, Au, ITO, and Ag.

8. The SRAM device of claim 1, with each of the first and second nanowires being made from one material selected from the group consisting of a carbon-based material, a Pt-based material, an Si-based material, a GaN-based material, a GaAs-based material, and a ZnO-based material.

9. The SRAM of claim 8, with each of the first and second nanowires being made from one material selected from the group consisting of carbon fiber, carbon nanotubes (CNT), Pt, Si, GaN, GaAs, and ZnO.

10. The SRAM device of claim 1, with each of the first and second nanowires being formed to have a height of approximately 0.1 µm to approximately 100 µm.

11. The SRAM device of claim 1, with each of the first and second nanowires being formed to have a diameter of approximately 1 nm to approximately 200 nm.

12. The SRAM device of claim 1, with a height of the gate electrode being approximately 0.1 µm to approximately 100 µm.

* * * * *